(12) United States Patent
Dyer et al.

(10) Patent No.: US 7,488,660 B2
(45) Date of Patent: Feb. 10, 2009

(54) EXTENDED RAISED SOURCE/DRAIN STRUCTURE FOR ENHANCED CONTACT AREA AND METHOD FOR FORMING EXTENDED RAISED SOURCE/DRAIN STRUCTURE

(75) Inventors: Thomas W. Dyer, Pleasant Valley, NY (US); Sunfei Fang, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 421 days.

(21) Appl. No.: 11/307,759

(22) Filed: Feb. 21, 2006

(65) Prior Publication Data
US 2007/0194387 A1 Aug. 23, 2007

(51) Int. Cl.
*H01L 21/336* (2006.01)
(52) U.S. Cl. .................................. 438/300; 438/199
(58) Field of Classification Search .................. 438/300, 438/199; 257/369
See application file for complete search history.

(56) References Cited

U.S. PATENT DOCUMENTS

| | | | |
|---|---|---|---|
| 4,998,150 A | * | 3/1991 | Rodder et al. ............... 257/288 |
| 5,683,924 A | * | 11/1997 | Chan et al. ................... 438/300 |
| 5,915,183 A | | 6/1999 | Gambino et al. |
| 6,169,017 B1 | | 1/2001 | Lee |
| 6,228,729 B1 | | 5/2001 | Ni |
| 6,566,208 B2 | | 5/2003 | Pan et al. |
| 6,727,135 B2 | | 4/2004 | Lee et al. |
| 6,774,000 B2 | * | 8/2004 | Natzle et al. ................. 438/300 |
| 7,138,320 B2 | * | 11/2006 | van Bentum et al. ........ 438/300 |
| 7,338,872 B2 | * | 3/2008 | Schwan et al. .............. 438/300 |

* cited by examiner

*Primary Examiner*—Douglas M Menz
(74) *Attorney, Agent, or Firm*—Graham Jones; H. Daniel Schnurmann

(57) ABSTRACT

A semiconductor device comprises a gate electrode stack having sidewalls and a top surface with a gate dielectric layer and the gate electrode, and LDD/LDS regions in the substrate aligned with the stack. Conformal L-shaped etch-stop layers with a thickness from about 50 Å to about 200 Å are formed with a vertical leg on the sidewalls of the stack and a horizontal leg reaching over the LDD/LDS regions next to the stack. RSD regions are formed in contact with the substrate aside from the etch-stop layers. The RSD regions cover the horizontal leg of the etch-stop layer and cover at least a portion of the vertical leg of the etch-stop layer on the sidewall of the gate electrode.

10 Claims, 24 Drawing Sheets

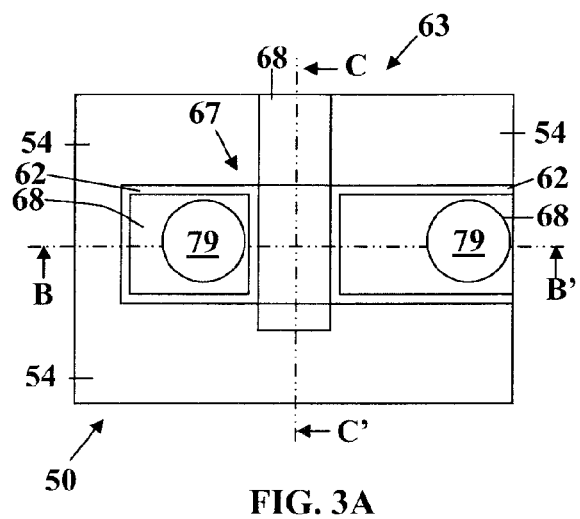
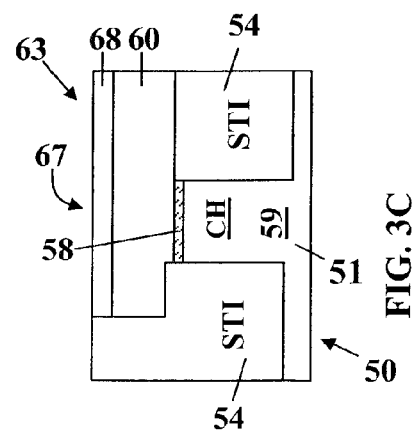
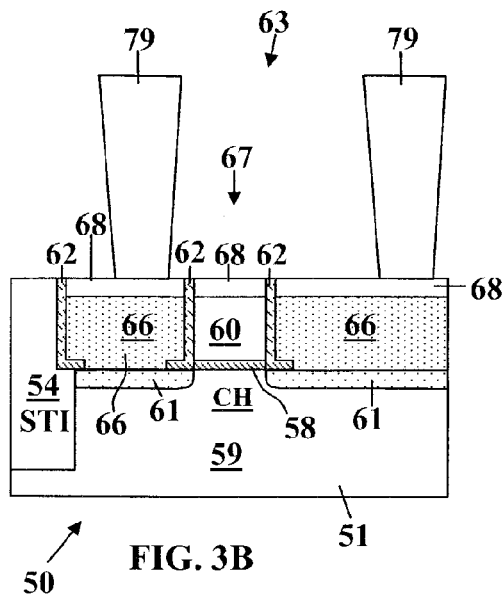
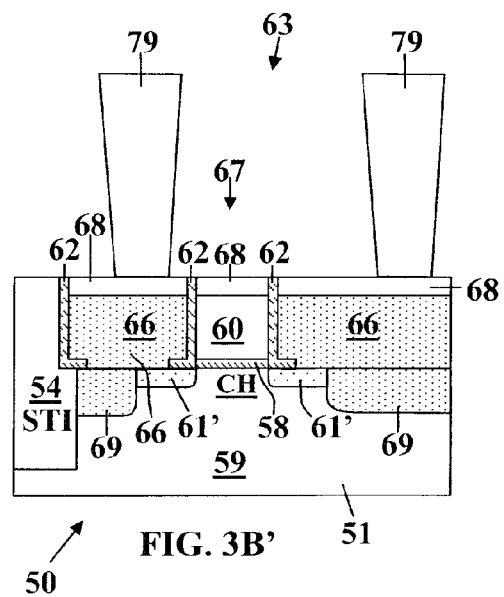
FIG. 3A
FIG. 3C
FIG. 3B
FIG. 3B'

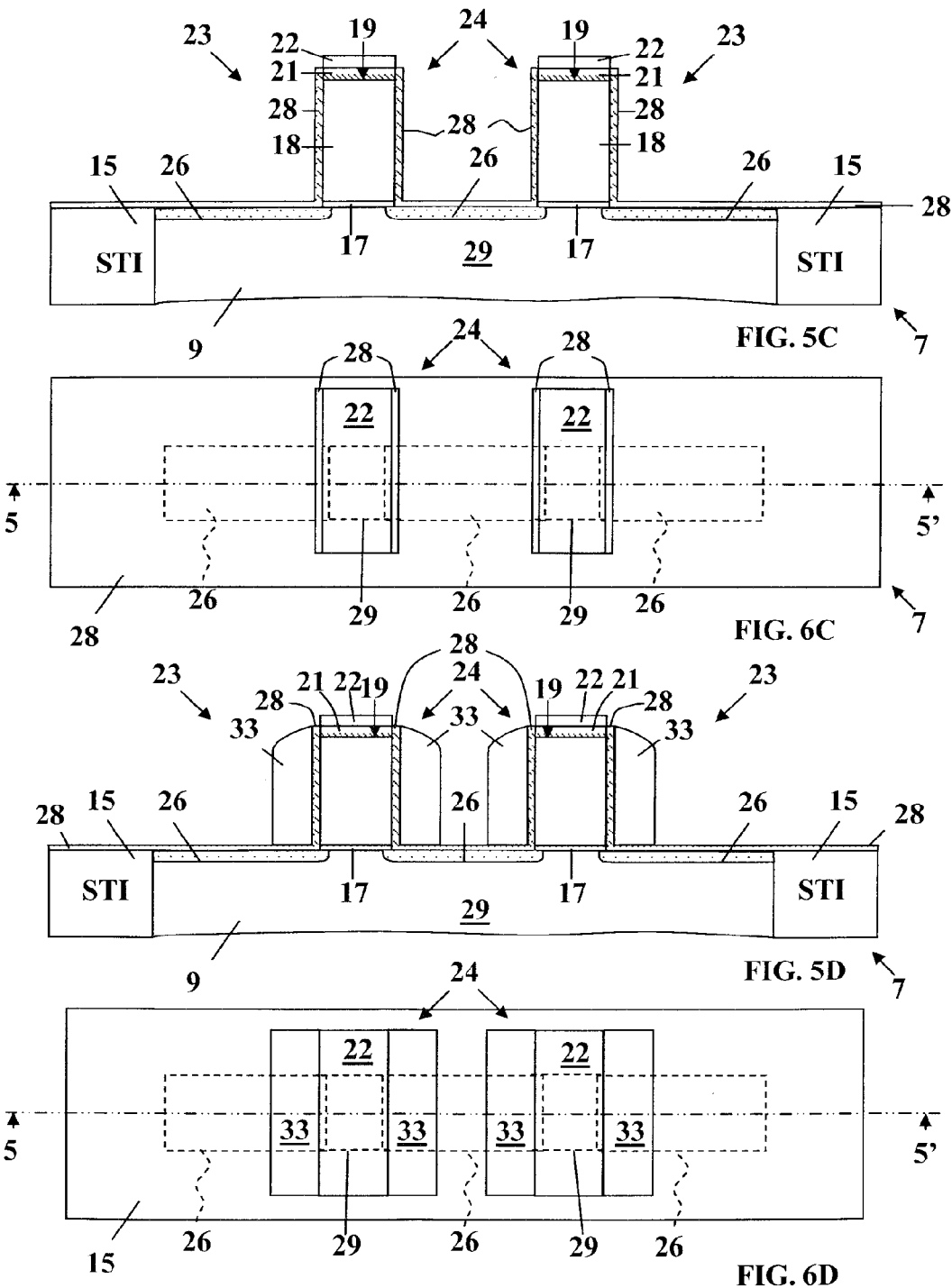

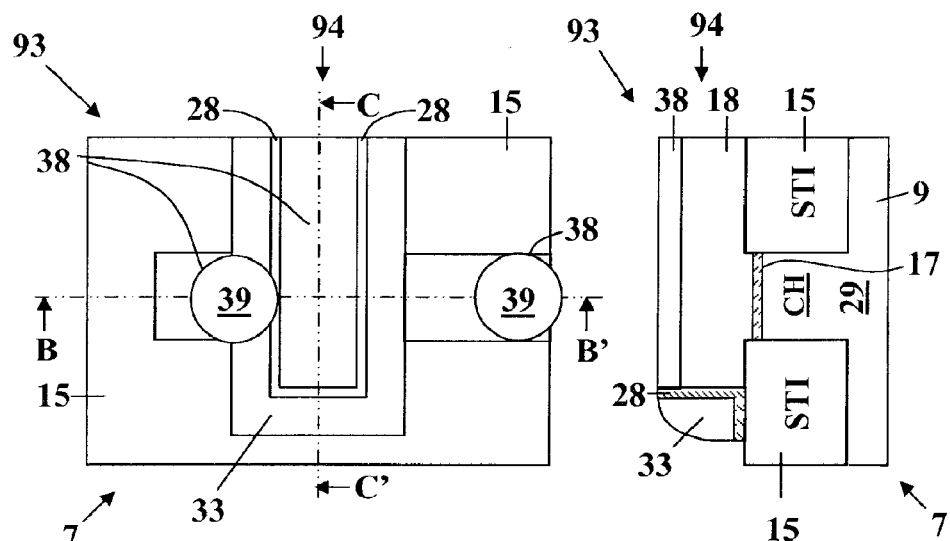
FIG. 9A PRIOR ART
FIG. 9C PRIOR ART
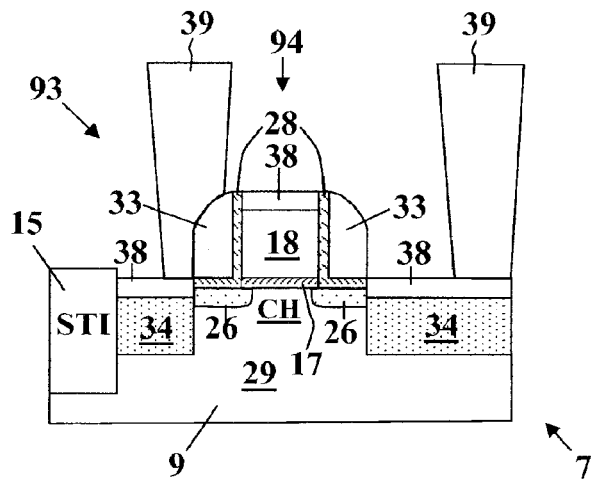
FIG. 9B PRIOR ART

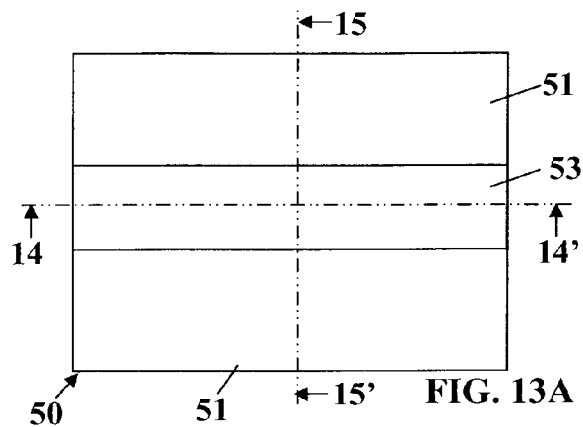
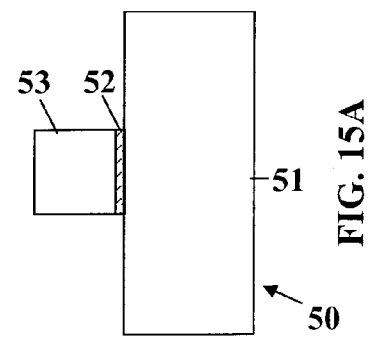
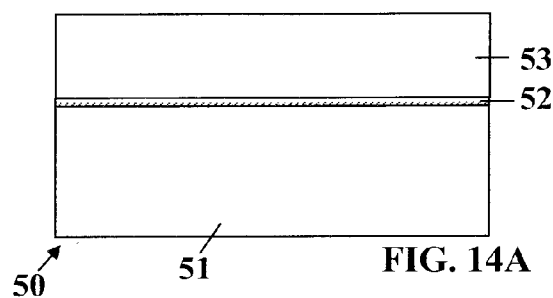
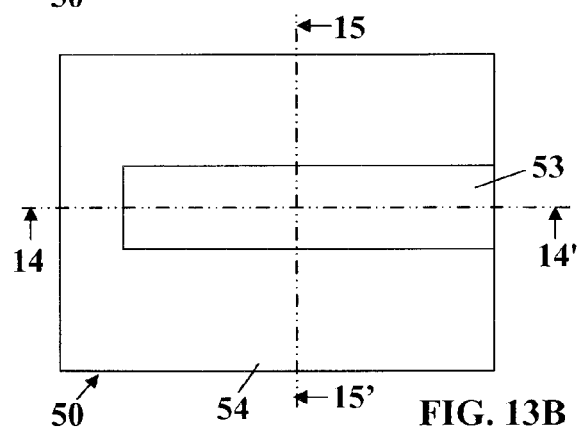
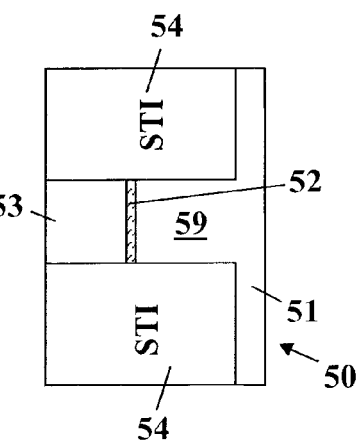
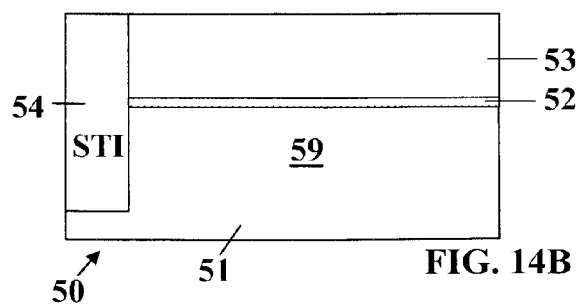

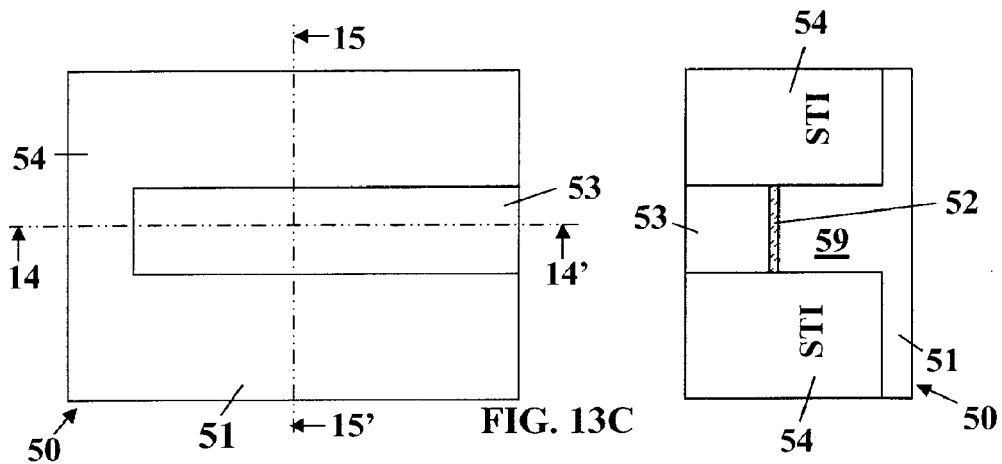
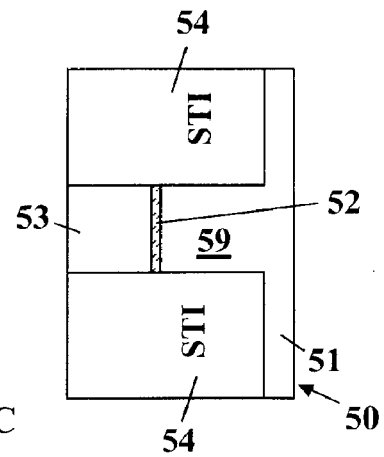
FIG. 13C
FIG. 15C
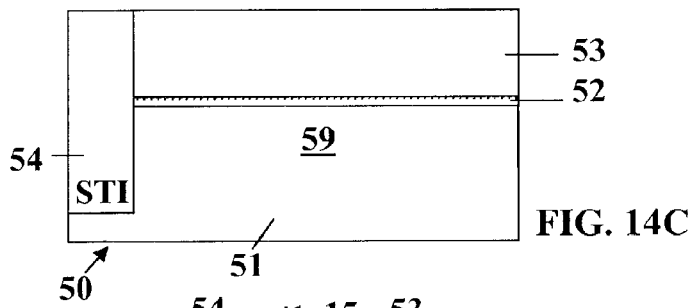
FIG. 14C
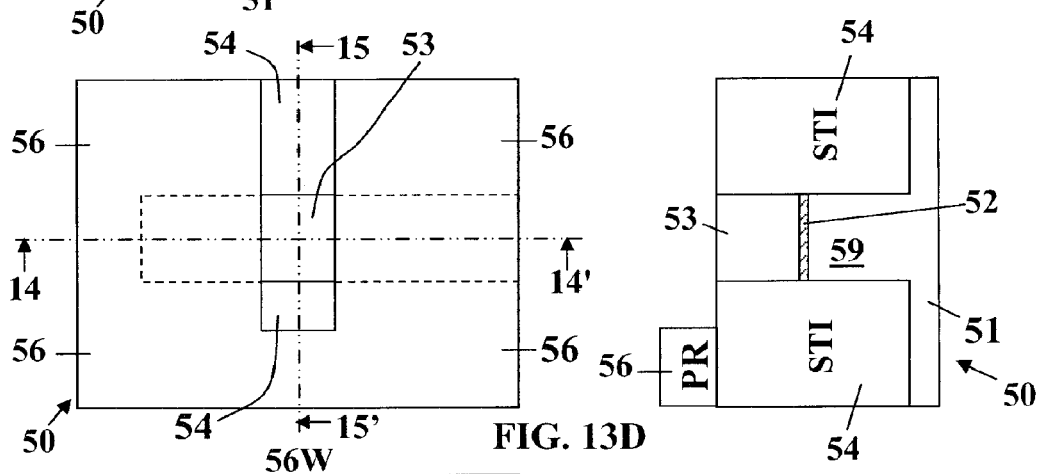
FIG. 13D
FIG. 15D
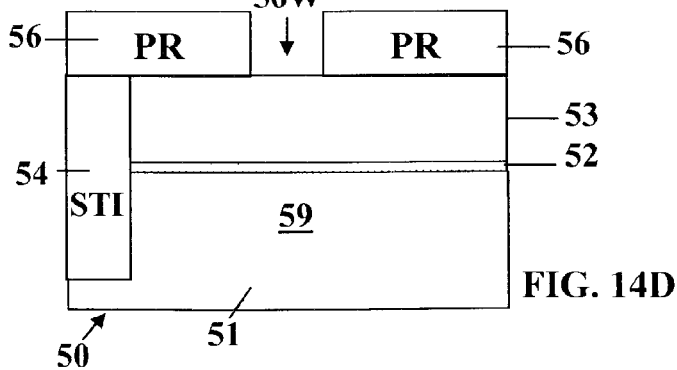
FIG. 14D

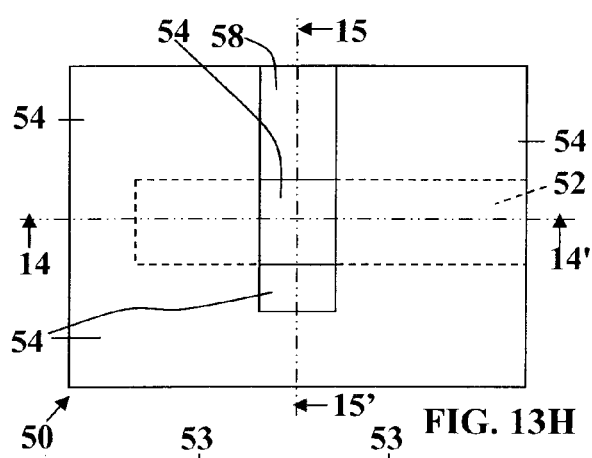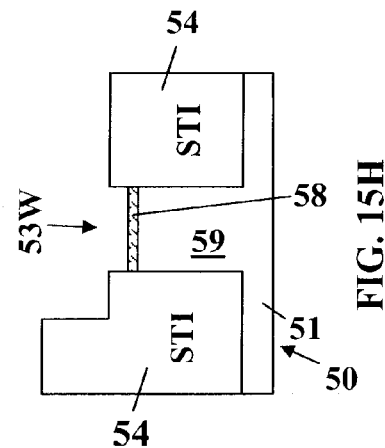
FIG. 13H
FIG. 15H
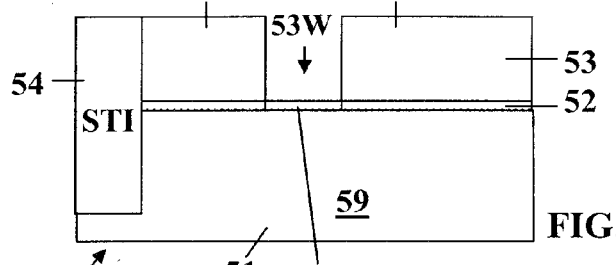
FIG. 14H
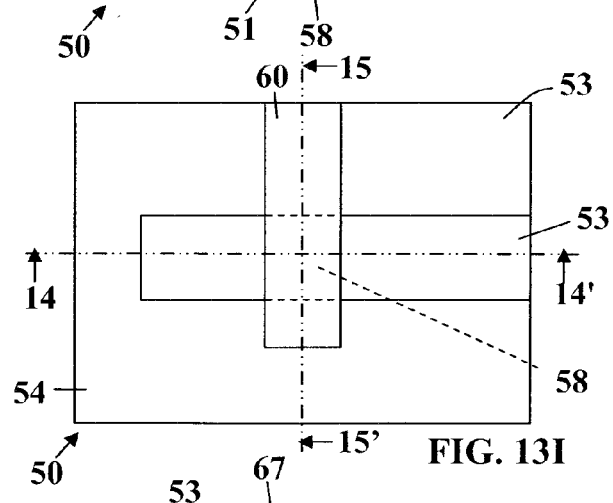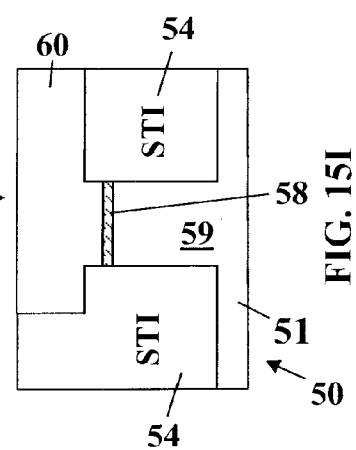
FIG. 13I
FIG. 15I
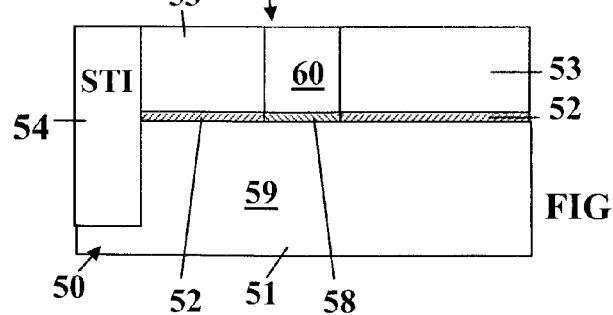
FIG. 14I

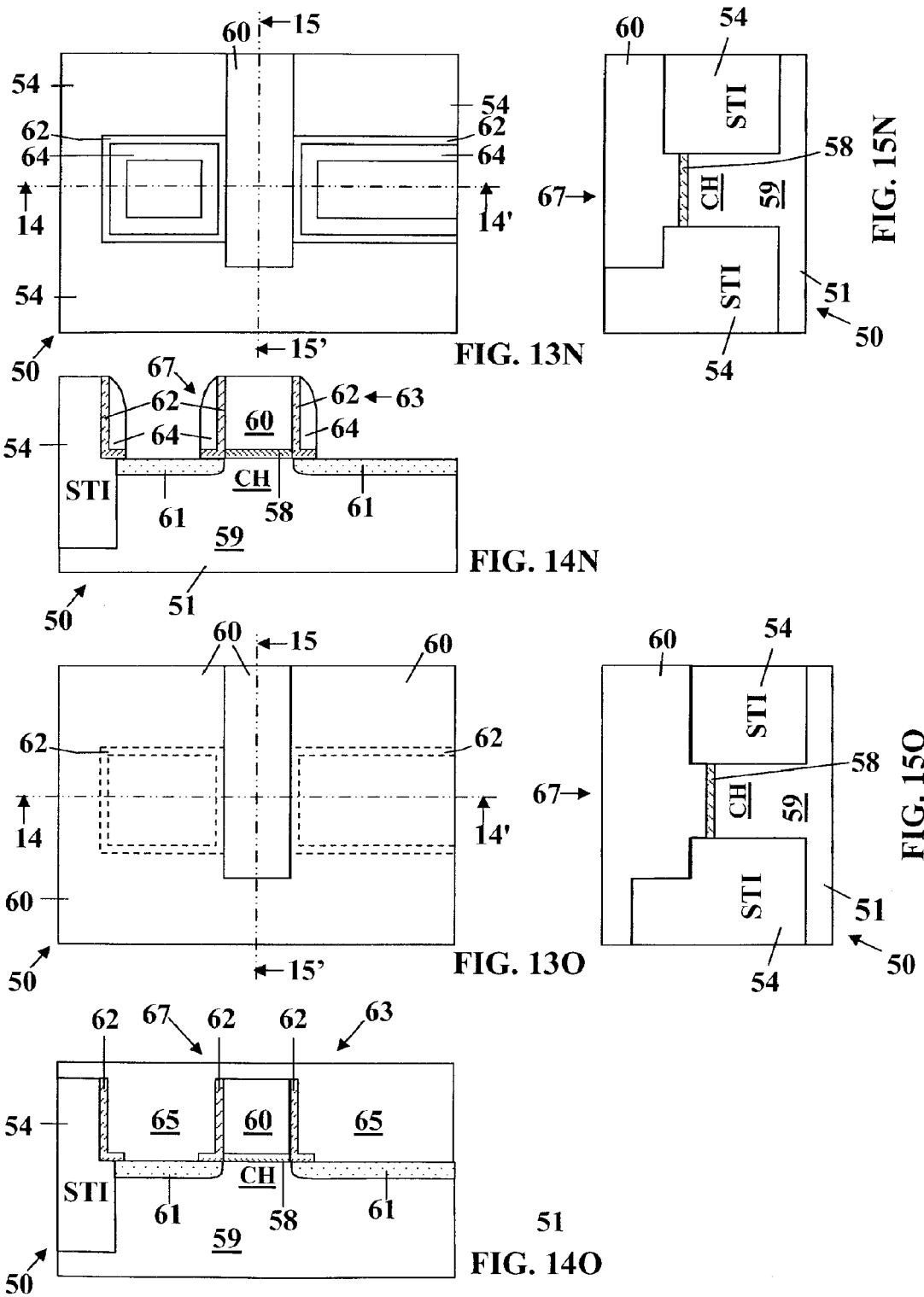

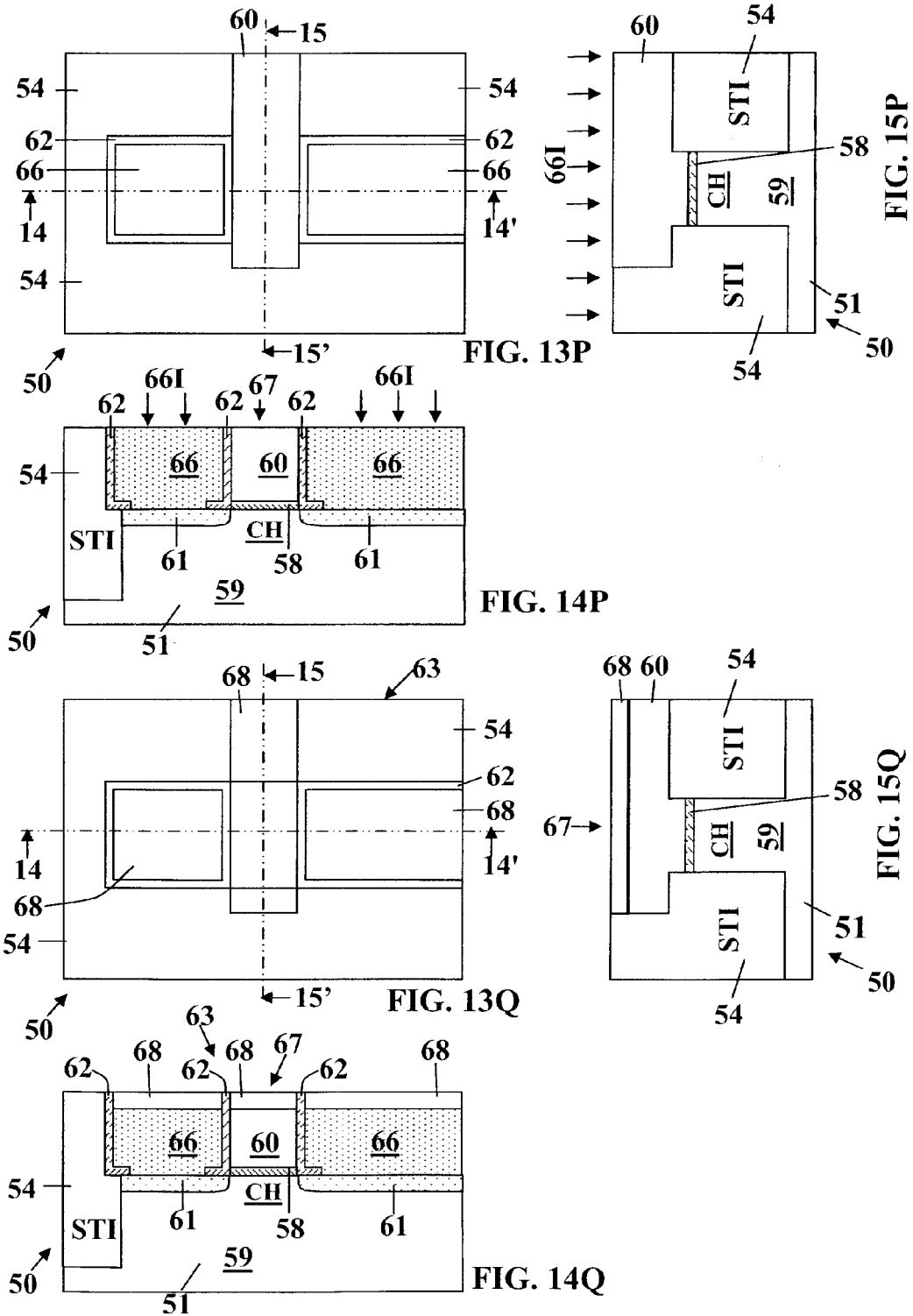

EXTENDED RAISED SOURCE/DRAIN STRUCTURE FOR ENHANCED CONTACT AREA AND METHOD FOR FORMING EXTENDED RAISED SOURCE/DRAIN STRUCTURE

BACKGROUND OF THE INVENTION

This invention relates to semiconductor Field Effect Transistor (FET) devices with Raised Source/Drain (RSD) junctions and manufacturing methods therefor, and more particularly, RSD Metal Insulator Semiconductor (MIS) or Metal Oxide Semiconductor (MOS) FET devices including Complementary MISFET and MOSFET devices and methods of manufacture thereof wherein spacers are formed on the sidewalls of a gate conductor.

As integrated circuit dimensions inexorably become smaller and smaller thereby reducing the scale of FET devices, we have found that making electrical and mechanical contact of studs extending from an upper surface of a device at junctions with the RSD source and drains regions of devices becomes increasingly more difficult. To make proper connections to the RSD regions, it is required to etch via holes down to a predetermined depth below that upper surface without missing the target laterally in whole or in part.

An important priority is to assure that the contacts made through via holes connect to conductive materials on the surfaces of RSD regions and not to lateral dielectric materials, i.e. electrical insulators. However in the past the practice has been to form sidewall spacers on the sidewalls of the gate electrodes of the FET devices, with the RSD regions juxtaposed with the sidewall spacers on the opposite sides thereof from the gate electrodes. We have found that the presence of the sidewall spacers which are composed of dielectric materials in locations where via holes might be etched because of minor deviations of the location thereof from the desired location will lead to making partial or total connection to the spacer composed of a dielectric material instead of the electrically conductive contact surface on top of the RSD regions.

A prior art approach to forming RSD regions in FET devices which illustrates the problems described above is shown in FIG. 2, U.S. Pat. No. 5,915,183 of Gambino et al. entitled "Raised Source/Drain using Recess Etch of Polysilicon" shows a MOS FET semiconductor device 6 comprising a semiconductor substrate 8 doped with p-type dopant. Raised Shallow Trench Isolation (STI) regions 16 filled with silicon dioxide ($SiO_2$) are formed on the periphery of the surface of the semiconductor substrate 8. A gate dielectric layer 30 is formed on the central portion of the surface of the substrate 8 and a gate electrode 72 is formed on the gate dielectric layer 30 in a gate electrode trench 20, centered between the STI regions 16 which are on the distal borders of the portion of device 6. Two source/drain extensions 42, which are doped with n-type dopant, are formed in the surface of the substrate 8 aside from the gate electrode 72. Raised source/drain (RSD) regions 74 are formed on the surface of the substrate 8 spaced away from the gate electrode 72 by the width of a set of conventional sidewall spacers 40 composed of silicon nitride ($Si_3N_4$.) A set of salicide layers 70 cover the RSD regions 74 and the gate electrode 72. The conventional spacers 40, composed of silicon nitride, are wide enough to provide a very substantial reduction in the width of the RSD regions 74 on both the edges proximate to the gate electrode 72 and the edges proximate to the raised STI trenches 16. As a function of the continuing trend towards the reduction in the dimensional scale of FET devices, the reduction in the width of the RSD regions 74 results in ever increasing difficulty in making sufficiently conductive and adequately aligned electrical connections thereto in vias formed in structure of a large scale semiconductor product.

The process described in Gambino et al for manufacture of the device 6 of FIG. 2 starts with formation of an original silicon nitride layer (12) over a pad oxide layer (14) formed on top of the semiconductor substrate 8. A pair of raised STI regions 16 filled with isolation material are formed on the edges of the original silicon nitride layer (12.) Then a gate electrode trench 20 reaching down through the silicon nitride layer (12) and is formed followed by removal of the exposed portion of the pad oxide layer (14) and deposition into the gate electrode trench 20 of both a gate dielectric layer 30 and a gate electrode layer (32), composed of polysilicon. Next, the gate electrode layer (32) is planarized to provide the planar gate electrode 72 seen in FIG. 2 herein followed by removal of the remainder of the original silicon nitride layer (12.) Thereafter source/drain extensions 42 are formed in the substrate 8 and sidewall spacers 40 are formed on the sidewalls of gate electrode 72 thereby defining source/drain recesses between sidewalls spacers 40 on the exposed sidewalls of the gate electrode 72 and on the exposed sidewalls of the STI regions 16. Next a blanket layer 74 of intrinsic polysilicon is deposited thereby filling the source/drain recesses followed by planarizing using CMP (Chemical Mechanical Polishing) combined with etching to form the RSD regions 74. Thus, the edges of the RSD regions 74 are defined by the sidewall spacers 40 and the raised STI regions 16. A salicide layer over 70 is formed on the top surfaces of both the gate conductor 72 and the RSD regions 74. Conventional polysilicon deposition, CMP, and recess steps are employed to form junctions to the RSD regions 74. A significant problem with the method and device of Gambino U.S. Pat. No. 5,915,183 is that it is difficult to make the connections of the junctions to the RSD regions 74 of the device 6 because of the narrowing thereof attributable to the widths of the sidewall spacers 40. An object of this invention is to overcome that problem.

U.S. Pat. No. 6,566,208 of Pan et al. entitled "Method to Form Elevated Source/Drain Using Poly Spacer" describes a method for forming a sub-quarter micron MOS FET having an elevated source/drain structure. A gate dielectric and a gate electrode are formed over a semiconductor substrate. Ions are implanted into the semiconductor substrate to form lightly doped regions using the gate electrode as a mask. Then thin, dielectric, sidewall spacers from 25 Å to 200 Å thick are formed on sidewalls of the gate electrode. A thicker, heavily doped, polysilicon layer from 500 Å to 4000 Å thick is deposited overlying the semiconductor substrate, gate electrode, and the thin, dielectric, sidewall spacers. The heavily doped polysilicon layer is etched back to leave tapered polysilicon sidewall spacers covering the dielectric sidewall spacers. Then dopant is diffused from the polysilicon spacers into the semiconductor substrate to form source and drain regions underlying the polysilicon sidewall spacers. The polysilicon spacer on an end of the gate electrode is removed to separate the polysilicon spacers into a source polysilicon spacer and a drain polysilicon spacer thereby completing formation of a MOSFET having an elevated source/drain structure in the fabrication of an integrated circuit device. The raised source/drain regions of Pan et al U.S. Pat. No. 6,566,208 are narrow and tapered with the lightly doped regions extending far to the sides. There is very little surface area on the RSD (raised source/drain) regions for making contact connections and the surface is sloped rather than level.

U.S. Pat. No. 6,727,135 of Lee et al. entitled "All-in-One Disposable/Permanent Spacer Elevated Source/Drain, Self-Aligned Silicide CMOS" describes a CMOS device having silicide contacts that are self-aligned to deep junction edges formed within a surface of a semiconductor substrate as well as a method of manufacturing the device. The CMOS device includes patterned gate stack regions formed on a surface of a semiconductor substrate with L-shaped silicon nitride sidewall spacers formed on the vertical sidewalls thereof. Each nitride spacer has a vertical element on the sidewalls of the stack regions plus a horizontal element that is formed on the substrate abutting the gate stack region. Silicide contacts are located on other portions of the semiconductor substrate between adjacent patterned gate stack regions not containing the horizontal element of the L-shaped silicon nitride spacer. There are no raised source/drain regions and no raised STI regions in the structure of Lee et al. U.S. Pat. No. 6,727,135.

U.S. Pat. No. 6,169,017 of Lee entitled "Method to Increase Contact Area" describes a method for fabrication of a semiconductor device with a modified gate contact area. A conformal first sacrificial layer is formed on the silicon substrate and the gate structure. A second sacrificial layer is formed on the silicon substrate, so that the surface of the second sacrificial layer is lower than the top of the polysilicon gate. Then the exposed sacrificial layer is removed, followed by forming a conformal silicon layer covering the silicon substrate. A sidewall spacer is formed on the gate structure. Using the spacer as a mask, the exposed polysilicon layer is removed to form a side-wing polysilicon layer on both sides of the gate to increase the contact area of the gate. Then the spacer, the second sacrificial layer, and the first sacrificial layer are removed. Silicidation is conducted to form a silicide layer on the gate structure and the two side-wing polysilicon layer to lower the gate contact resistance.

U.S. Pat. No. 6,228,729 of Ni entitled "MOS Transistors Having Raised Source and Drain and Interconnects" describes a process for fabricating a CMOS semiconductor device comprising a gate electrode with a raised source/drain structure and with an interconnect inlaid into isolation region. The process comprises the following steps. Form a first dielectric layer and a first conductor layer on the substrate. Form one or more inset isolation regions in the substrate. Fill each inset isolation region with an isolation layer. Form a second dielectric layer on top of the first conductor layer and the isolation layers. Form a first and a second trench simultaneously. Form cavities at the bottom of the first trench. Fill each cavity with a second conductor layer. Form dielectric sidewalls and a dielectric bottom layer in the first trench. Form the gate electrode and an interconnect by filling the first and second trenches with a third conductor layer. Dope the first conductor layer. Then form the raised source/drain by driving the dopant into the surface region of the substrate.

Beyond the 65 nm node of the CMOS technology roadmap, the requirements for gate polysilicon line spacing and source/drain spacer dimension make it increasingly difficult to land contacts effectively between the tightly spaced lines. Removal of silicon nitride spacers is being considered but does not effectively address the problem of making good electrical contacts. This is because the area opened up by removing the nitride spacer is still covered by a thin oxide etch-stop layer that will prevent an electrical connection in that area.

Removal of this thin oxide etch-stop layer before forming the contacts poses a different problem. In this case, the usual contact hole etching process would have to stop abruptly on the silicon surface over the shallow source/drain extension. If it did not stop abruptly enough, then it would etch through the shallow diffusion and cause an electrical short circuit across the junction of the device thereby resulting in very high junction leakage.

Current contact etching processes are designed to stop on the metal silicide material that is formed over the source/drain regions. This silicide does not extend over the extension regions. Attempts to form silicide over the extension regions lead directly to high junction leakages, since the silicide penetrates to a depth that is deeper than the extension diffusion depth.

The design objective it to have the contact etch-stop on the top surface of a silicide layer above the doped silicon of the raised source/drain regions to provide a good processing margin for a high quality contact. Without such an intermediate silicide layer, there is potential for the overetching the contact hole being formed in the device down into the silicon therebelow and punching through one or more of the shallow extension regions (i.e. the LDD/LDS regions) into the active area of the silicon substrate.

If the contact etch were to stop on a silicon oxide layer as well as a silicide layer, then high contact resistance would be a problem since part of the contact be made to the silicon oxide which is an electrical insulator.

SUMMARY OF THE INVENTION

In accordance with this invention, a semiconductor device comprises a gate electrode stack having sidewalls and a top surface with a gate dielectric layer and the gate electrode, and Lightly Doped Drain/Lightly Doped Source (LDD/LDS) regions in the substrate aligned with the stack. Conformal L-shaped etch-stop layers, from about 50 Å to about 200 Å thick, are formed with a vertical leg on the sidewalls of the stack and a horizontal leg reaching over the LDD/LDS regions next to the stack. Raised Source/Drain (RSD) regions are formed in contact with the substrate aside from the etch-stop layers. The RSD regions cover the horizontal leg of the etch-stop layer and cover at least a portion of the vertical leg of the etch-stop layer on the sidewall of the gate electrode.

In accordance with this invention, a semiconductor device comprises a gate electrode stack with a gate dielectric layer and a gate electrode on the substrate with the gate electrode stack having sidewalls and a top surface with LDD/LDS regions in the substrate self-aligned with the gate electrode stack. Conformal L-shaped etch-stop layers having a vertical leg are formed on the sidewalls of the gate electrode stack and a horizontal leg is formed over the LDD/LDS regions proximate to the gate electrode stack. RSD regions are formed in contact with the substrate aside from the etch-stop layers. The RSD regions cover the horizontal leg of the etch-stop layer and cover at least a portion of the vertical leg of the etch-stop layer on the sidewall of the gate electrode.

Preferably, the conformal etch-stop layer has a thickness within a range from a minimum thickness of about 50 Å to a maximum thickness of about 200 Å. The LDD/LDS regions formed in the substrate extend aside from the horizontal leg of the etch-stop layer and with the RSD regions in direct contact with LDD/LDS regions aside from the horizontal leg of the etch-stop layer. A conductive cap layer is formed over the RSD regions reaching into contact with the etch-stop layer on the sidewall of the gate electrode stack. Preferably the conductive cap layer comprises a metal silicide. An STI region is formed in the substrate with the RSD region being deposited over a portion of the STI region In another aspect of this invention the RSD regions comprise planarized deposits formed above the substrate, and preferably, the RSD regions, the etch-stop layer, and the gate electrode have coplanar top surfaces.

In still another aspect of this invention, the RSD regions comprise epitaxial deposits formed above the substrate covering portions of the vertical leg and all of the horizontal leg of the etch-stop layer.

Preferably, source/drain regions are formed in the substrate aside from the horizontal leg of the etch-stop layer in direct contact with the RSD regions thereabove; and the RSD regions comprise deposits formed above the substrate covering all of the vertical leg and all of the horizontal leg of the etch-stop layer.

In accordance with another aspect of this invention, a method is provided for forming a structure in a semiconductor substrate. The structure includes a stack of a gate dielectric layer and a gate electrode formed over the substrate, and raised source/drain junctions. The method includes the following steps. Form a gate electrode stack comprising the gate dielectric layer and the gate electrode on the substrate with the gate electrode stack having sidewalls and a top surface. Form Lightly Doped Drain/Doped Source (LDD/LDS) regions in the substrate self-aligned with the gate electrode. Form a conformal etch-stop layer on the device. Form sidewall spacers having a given width over the etch-stop layer on the sidewalls of the gate electrode stack. Etch away portions of the etch-stop layer unprotected by the sidewall spacers. Then form Raised Source/Drain (RSD) regions on the substrate over exposed portions of the LDD/LDS regions in the substrate and covering the etch-stop layer over at least a portion of the sidewalls of the gate electrode.

Preferably, the etch-stop layer has a thickness within a range from a minimum thickness of about 50 Å to a maximum thickness of about 200 Å.

In an aspect of this invention, remove the sidewall spacers prior to the step of forming the RSD regions.

Form source/drain regions in the substrate after forming the sidewall spacers. Then remove the sidewall spacers prior to the step of forming the RSD regions.

Preferably, retain the sidewall spacers prior to the step of forming the RSD regions and preferably incorporate the sidewall spacers in the RSD regions.

Preferably, form source/drain regions in the substrate after forming the sidewall spacers. In that case as well another aspect of this invention is that the sidewall spacers are incorporated into the RSD regions.

L-shaped portions of the etch-stop layer remain on the sidewalls of the gate electrode stack extending laterally from gate electrode stack by the given width of the spacers. The RSD are formed by epitaxial growth of silicon over the substrate and over a portion of the etch-stop layer into juxtaposition with the sidewalls.

Form the RSD regions by blanket deposition of RSD silicon covering the substrate and the spacers followed by etching back the RSD silicon and doping thereof. Form the sidewall spacers from silicon nitride. Subsequently perform the step of etching away portions of the etch-stop layer unprotected by the sidewall spacers. Then remove the sidewall spacers. Then grow the RSD regions over the substrate.

Form the sidewall spacers from polysilicon. Subsequently perform the step of etching away portions of the etch-stop layer unprotected by the sidewall spacers. Then deposit a blanket layer of polysilicon, and then etch back the polysilicon to form the RSD regions.

The invention and objects and features thereof will be more readily apparent from the following detailed description and appended claims when taken with the drawings.

BRIEF DESCRIPTION OF THE DRAWINGS

The foregoing and other aspects and advantages of this invention are explained and described below with reference to the accompanying drawings, in which:

FIG. 1A is a section taken along line A-A' in FIG. 1B showing a front, elevational, sectional view of an FET RSD semiconductor device without sidewall spacers between the RSD regions and the gate electrode. FIG. 1B is a plan view of the RSD FET semiconductor device of FIG. 1A.

FIGS. 1A' and 1B' show the structure of a second preferred embodiment of this invention which is a modification of the embodiment of FIGS. 1A and 1B. FIG. 1A' is an elevational, front, sectional view of an FET RSD semiconductor device in accordance with this invention which shows a section taken along line A-A' in FIG. 1B'. FIG. 1B' is a plan view of the device of FIG. 1A'.

FIG. 3A—is a plan view of an RSD FET device in accordance with a third preferred embodiment of this invention. FIG. 3B shows a front, sectional, elevation taken along line B-B' in FIG. 3A. FIG. 3B' shows a front, sectional, elevation taken along line B-B' in FIG. 3A of a fourth preferred embodiment of this invention which is a modification of the embodiment of FIG. 3B which has source/drain regions formed in the active area of the substrate. FIG. 3C is a right side, sectional, elevation taken along line C-C' in FIG. 3A.

FIGS. 5A-5K are sectional, front elevational views taken along line 5-5' in FIGS. 6A-6K illustrating the steps of the process of FIG. 4 of the device of FIGS. 1A and 1B in various stages of manufacture.

FIGS. 6A-6K are plan views illustrating the steps of the process of FIG. 4 of the device of FIGS. 1A and 1B in various stages of manufacture. FIGS. 6A-6K depict steps which correspond to the steps illustrated by FIGS. 5A-5K.

FIG. 8A shows a front elevational section taken along line A-A' in FIG. 8B of the prior art device of FIGS. 7A and 7B without sidewall spacers and without RSD regions. FIG. 8B is a plan view of the device of FIG. 8A.

FIGS. 9A-9C show three views of a single prior art FET device with sidewall spacers and without RSD regions. FIG. 9A is a plan view of the device. FIG. 9B shows a front, elevational, section which is taken along line B-B' in FIG. 9A. FIG. 9C is a right elevation taken along line C-C' in FIG. 9A.

10A is a plan view of the prior art device 7 as shown in FIG. 8A and FIG. 10B is a section taken along line B-B' in FIG. 10A.

FIG. 11A shows a plan view of a modification of the fourth embodiment of this invention as shown in FIG. 3A. FIG. 11B is a section taken along line B-B' in FIG. 11A. The teachings of FIGS. 11A and 11B are explained below with reference to the flowchart of FIG. 12 and to the process details illustrated in detail by FIGS. 13A-13O, FIGS. 14A-14O, and FIGS. 15A-15O.

DESCRIPTION OF THE PREFERRED EMBODIMENTS

First Preferred Embodiment

Figure 1A:
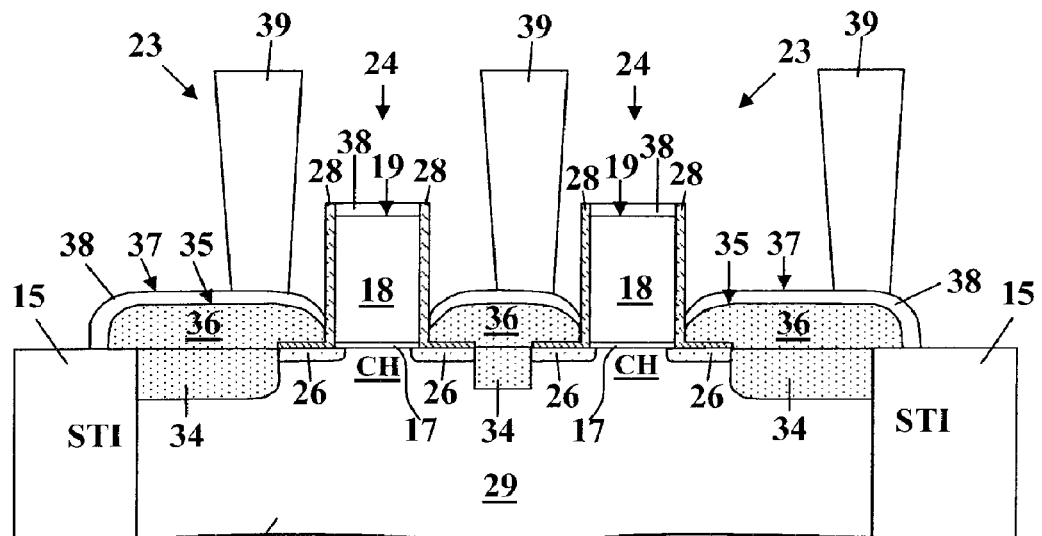
FIGS. 1A and 1B show the structure of a first preferred embodiment of this invention in cross-sectional and top-down views.
Figure 1B:
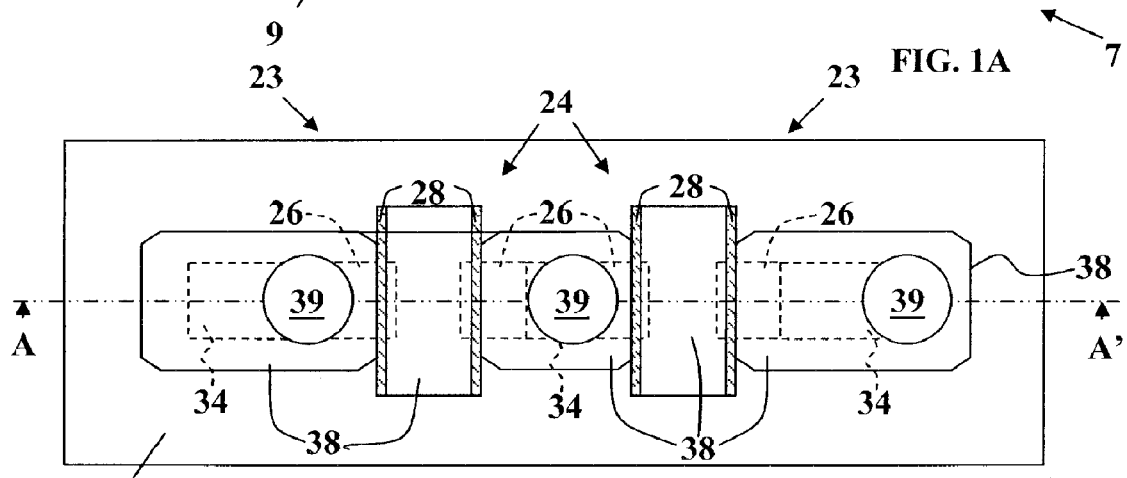
Figure 2:
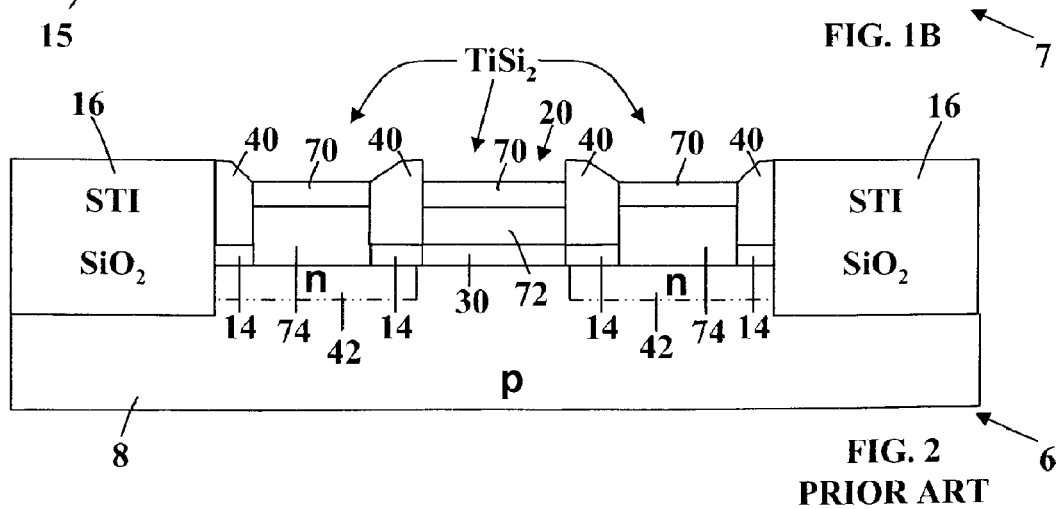
FIG. 2 shows a prior art approach to forming RSD regions in FET semiconductor devices with RSD regions illustrating the problems described above.
Figure 1A:
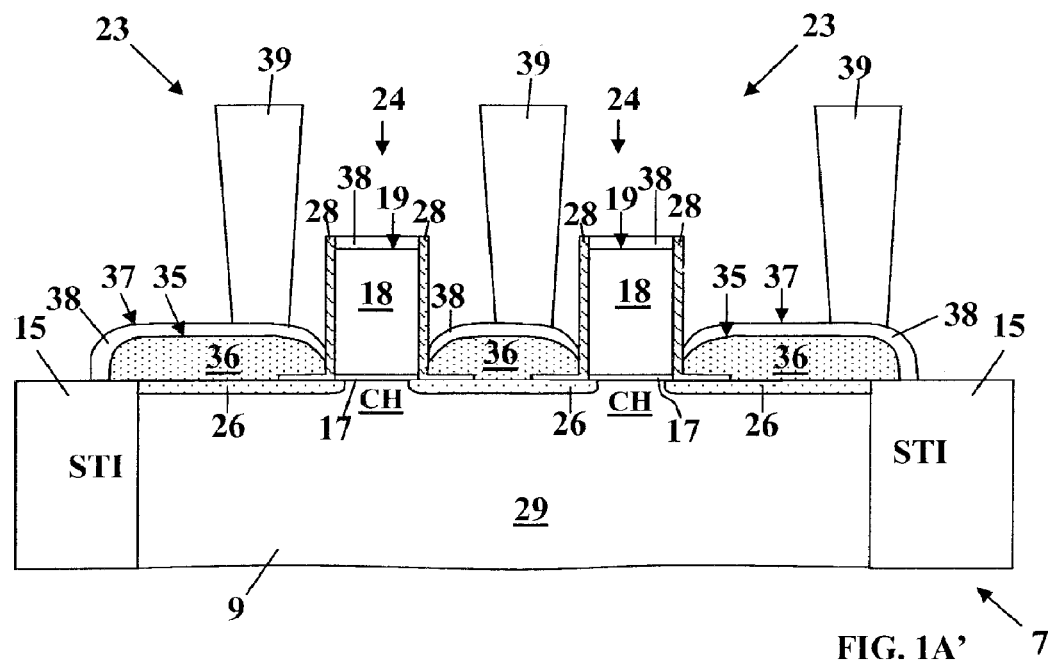
Figure 1B:
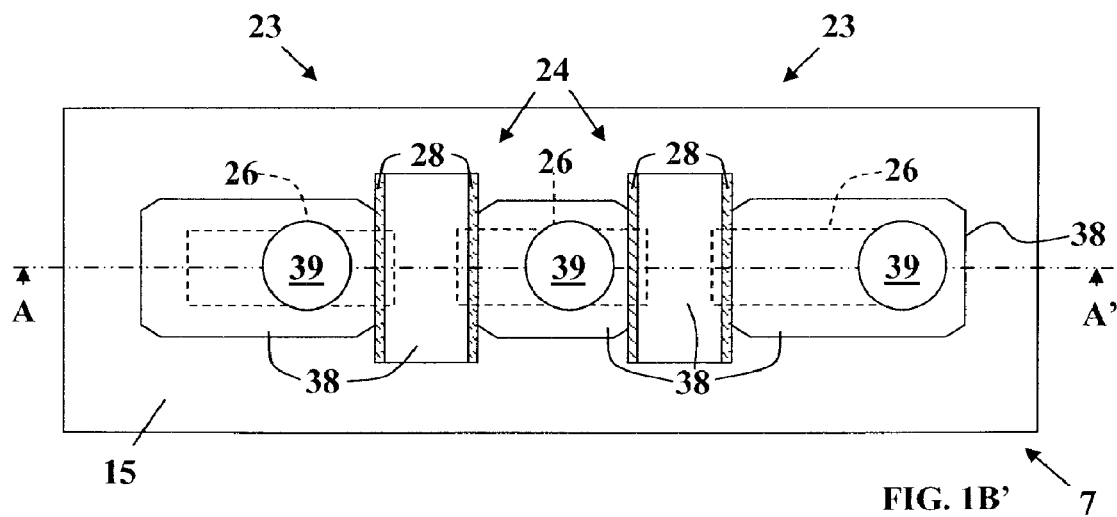

FIG. 1A shows a front, elevational, sectional view of a Complementary Metal Insulator Semiconductor (CMIS) or Complementary Metal Oxide Semiconductor (CMOS) FET, Raised Source/Drain (RSD) semiconductor device 7 without sidewall spacers between the RSD regions and the gate electrode in accordance with this invention. FIG. 1A shows a section taken along line A-A' in FIG. 1B. FIG. 1B is a plan view of the CMIS/CMOS RSD FET semiconductor device 7.

Referring to FIG. 1A, the semiconductor device 7 is formed on a lightly doped, monocrystalline semiconductor substrate 9 in which lateral Shallow Trench Isolation (STI) regions 15 have been formed defining an active area 29. The STI regions 15 surround two FET devices 23 which include a pair of gate electrode stacks 24 with channel regions CH therebelow in the active area 29. Each gate electrode stack 24 includes a gate dielectric layer 17 formed on the surface of the substrate 9 above the channel CH of that FET device 23, a gate electrode 18 (with vertically oriented sidewalls) formed over the gate dielectric layer 17, and a conductive cap layer 38 formed on top of the gate electrode 18. Lightly doped source/drain (LDD/LDS) extension regions 26 are formed in the active area 29 of the substrate 9 aligned with the sidewalls of the gate electrodes 18 and generally aside therefrom. The gate dielectric layer 17 is composed of a dielectric material (e.g. gate oxide, nitrided oxide, or high k dielectric material such as tantalum oxide ($Ta_2O_5$), hafnium oxide ($HfO_2$), zirconium oxide ($ZrO_2$), or aluminum oxide ($Al_2O_3$). The gate electrode 18 is composed of a conductor (e.g. doped polysilicon.) The conductive cap layer 38 is preferably composed of a silicide such as tungsten silicide (WSi), titanium silicide ($TiSi_2$), nickel (NiSi), platinum (PtSi), or cobalt silicide ($CoSi_2$). A conformal, thin, etch-stop layer 28 with an L-shaped cross-section (shaped like a dog leg) as seen in FIG. 1A (preferably deposited by a LTO process) with a thickness of about 50 Å-200 Å is formed on the sidewalls of the gate electrodes 18 and with a lower portion of the dog leg over the LDD/LDS extension regions proximate to the channels CH. However in accordance with this invention, as shown by FIGS. 1A and 1B, unlike conventional FET devices, there are no conventional sidewall spacers formed on the sidewalls and lower leg of the etch-stop layer 28. While the LDD/LDS extension regions 26 are formed in the active area 29 aside from the sidewalls of the gate electrodes 18 and generally aligned therewith, the more heavily doped source/drain regions 34 are formed in the active area 29 spaced away from the sidewalls of the gate electrodes 18 by the distance which has been provided by processing with sacrificial, conventional sidewall spacers, as will be explained in detail below. Epitaxial silicon RSD (Raised Source/Drain) regions 36 are formed over the source/drain regions 34. The RSD regions 36 extend partially over horizontal and vertical surfaces of the etch-stop layer 28 and partially beyond the active area 29 over the horizontal surfaces of the STI regions 15 adjacent to the source/drain regions 34. Thus the footprint of the RSD regions 36 with the conductive cap layer 38 is substantially larger than the footprint of the source/drain regions 34 formed in the active area 29. Metal conductive cap layers 38 cover outer surfaces 35 of the epitaxial silicon of the RSD regions 36 and top surfaces 19 of the gate electrodes 18. The central, upper surfaces 35 of the RSD regions 36 and the central, upper surfaces 37 of the conductive cap layers 38 with their large footprint are substantially planar and extend between the etch-stop layers 28 and the STI regions 15 on the margins and between the etch-stop layers 28 in the intermediate space between the pair of gate electrodes 18. The RSD regions 36 are proximate to the sidewalls of the gate electrodes 18 with only the thickness of the etch-stop layer 28 separating them from contact with the sidewalls of the gate electrodes 18. Moreover, because the RSD regions 36 overly portions of the STI regions 15, they provide a maximum horizontal (footprint) area for connections of the junctions to the layer 38 above the RSD regions 36. A set of three metal studs 39 is shown, with each one connected to one of the conductive cap layers 38. It should be noted that the three studs 39 are not well aligned with the source/drain regions 34 due to the problems of location of via holes for the studs 39 in the intermediate structure (not shown for convenience of illustration). On the other hand, the studs 39 have cross sections which fit well within the boundaries of RSD regions 36 which are designed in accordance with this invention to have a much larger footprint which overlaps the extensions 26 thereby averting the problems associated with connection to the smaller footprint of the source/drain regions 34. The studs 39 are formed on the top surface of the conductive cap layers 38 above the RSD regions 36, but reach to the right of the source/drain regions 34 in the active area 29 overlapping the LDD/LDS regions 26 or the STI region 15 which would be a problem if the RSD regions 36 and the conductive cap layers 38 did not extend beyond the footprints of the source/drain regions 34. Thus the dual advantages of providing a full rather than a partial contact area to the source/drain regions through the RSD regions 36 and avoidance of punchthrough if the studs 39 were directly above the LDD/LDS regions 26 are achieved with the configuration shown in FIGS. 1A and 1B.

The plan view of the CMIS/CMOS FET semiconductor device 7 shown in FIG. 1B shows the large surface area of the silicide layers 38 on the surface of the RSD regions 38 illustrating the extremely small degree of separation provided by the etch-stop layers 28 between the gate electrodes 18 and the silicide layers 38. It can be seen that the combination of both the RSD regions 36 and the silicide layers 38 extend outwardly in all directions from the source/drain regions 34 in the substrate 9 thereby providing the larger footprint described above. The STI region 15 is shown where it is formed in the substrate 9 surrounding the periphery of the active area 29 which supports the devices 23. It can be seen in FIG. 1B that the studs 39 are skewed far to the right of the centers of the source/drain regions 34.

Second Preferred Embodiment

FIG. 1A' and 1B' show a modification of the embodiment of FIGS. 1A and 1B. FIG. 1A' is an elevational, front, sectional view of a CMIS/CMOS, FET, RSD semiconductor device 7 in accordance with this invention which is a modification of the first preferred embodiment of FIG. 1A which shows a section taken along line A-A' in FIG. 1B'. FIG. 1B' is a plan view of the FET semiconductor device 7 of FIG. 1A'. In FIG. 1A', the source and drain regions 34 formed in the active area 29 of the substrate 9 have been omitted, while the LDD/LDS extensions 26 and the raised source/drain regions 36/38 remain along with the other features of the device of FIG. 1A. FIG. 1B' shows that the LDD/LDS extension regions 26 fill the spaces which were filled by the source/drain regions 34 in FIG. 1B. As with FIGS. 1A and 1B, the set of metal studs 39 are shown connected to the conductive cap layers 38. The studs 39 have cross sections which fit well within the boundaries of RSD regions 36 which separate the studs 39 from the wide extensions 26, thereby reducing the risk of having the studs overextending into the extension region where there would cause unwanted current leakage from the junctions to the substrate.

Third Preferred Embodiment

FIG. 3A is a plan view of a RSD, CMIS/CMOS, FET semiconductor device 50 in accordance with the third preferred embodiment of this invention. FIG. 3B shows a front, sectional, elevation taken along line B-B' in FIG. 3A. FIG. 3C is a right side, sectional, elevation taken along line C-C' in FIG. 3A.

Referring to FIGS. 3B and 3C, the semiconductor device 50 is formed on a doped semiconductor substrate 51 in which Shallow Trench Isolation (STI) regions 54 have been formed around the periphery of an FET device 63 which includes a gate electrode stack 67 with a channel CH therebelow in the active area 59 of the substrate 51. The gate electrode stack 67 includes a gate dielectric layer 58 formed on the surface of the substrate 59 above the channel CH, a gate electrode 60 (with vertically oriented sidewalls) formed on the gate dielectric and a cap layer 68 formed on top of the gate electrode 60. On opposite sides of the gate electrode stack two LDS/LDS regions 61 are formed in the substrate 51 aside from the sidewalls of the gate electrode 60 and generally aligned therewith. A conformal, L-shaped, etch-stop layer 62 (shaped like a dog leg with a vertical leg and a lower leg) with a thickness of about 50Å-200 Å, is formed on the sidewalls of the gate electrode 60 and over the margins of the LDD/LDS regions 61 proximate to the channel CH. A pair of RSD regions 66 is formed on the surface of the FET device 63 over the LDD/LDS regions 61, over the lower leg of the etch-stop layer 62, and in contact with the vertical leg of the etch-stop layer 62. The gate dielectric layer 58 is composed of a gate dielectric material (e.g. gate oxide, nitrided oxide, or high k dielectric material such as tantalum oxide ($Ta_2O_5$), hafnium oxide ($HfO_2$), zirconium oxide ($ZrO_2$, or aluminum oxide ($Al_2O_3$).

The gate electrode 60 is composed of a conductor (e.g. doped polysilicon.) The cap layer 68 is composed of a conductive material (e.g. a silicide such as tungsten silicide (WSi), titanium silicide ($TiSi_2$), nickel (NiSi), platinum (PtSi), or cobalt silicide ($CoSi_2$). The conformal, L-shaped, etch-stop layer 62 is preferably deposited by a LTO process to a thickness of about 50Å-200 Å, covering the sidewalls of the gate electrode 60 and covering the margins of the LDD/LDS regions 61 proximate to the channel CH. In this case, the heavily doped source/drain regions are omitted from the substrate 51 since the RSD regions 66 include sufficient source/drain material to meet the specifications for some RSD FET designs. The epitaxial silicon RSD regions 66 are formed over the LDD/LDS regions 61 extending over horizontal surfaces of the etch-stop layer 28 and partially over the vertical surfaces thereof. Conductive, cap layers 68 formed of a material such as a metal silicide are formed covering exposed, top surfaces of the RSD regions 66 and the top surface of the gate electrodes 60. In this design, the central, upper surfaces of the RSD regions 36 and the upper surfaces of the silicide layers are planar, which enhances the probability that via holes etched from an upper level in the device will reach to the cap layer 68 without extending down into the RSD regions 66. The RSD regions 66 are proximate to the sidewalls of the gate electrodes 18 with only the thickness of the etch-stop layer 62 separating them from contact with the sidewalls of the gate electrodes 60 and with the RSD regions 66 providing a maximum horizontal area for connections of the junctions to the metal conductive cap layer 68 above the RSD regions 66. As shown in FIG. 3A, the STI region 54 surrounds the FET device 63 except for the portions of the gate electrode stack 67 which reaches to the center of the top and the center of the right side of FIG. 3A. In other words, the STI region 54 extends from the top to the bottom to the left of the FET device 63 in FIG. 3A as shown by FIG. 3B, across below the FET device 63 in FIG. 3A as shown by FIG. 3C and from the upper left and upper right in FIG. 3A towards the portions of the gate electrode 60 and the metal conductive cap layer 68 as shown in FIG. 3C. Note that FIG. 3C shows that while the gate dielectric layer 58 is framed by the STI region 54, the gate electrode 60 and the metal conductive cap layer 68 overlap the STI region 54, as will be explained in detail below.

A set of two metal studs 79 is shown connected to the conductive cap layers 68. It should be noted that the two studs 79 are not well aligned with the source/drain regions 66, due to the problems of location of via holes for the studs 79 in the intermediate structure (not shown for convenience of illustration). On the other hand, the studs 79 have cross sections which fit well within the boundaries of RSD regions 66 which are designed in accordance with this invention to have a much larger footprint which overlaps the extensions 61. The studs 79 are formed on the top surface of the conductive cap layers 368 above the RSD regions 66, overlapping the LDD/LDS regions 61. Thus the dual advantages of providing a full rather than a partial contact area to the source/drain regions through the RSD regions 66 and avoidance of punchthrough if the studs 79 were directly above the LDD/LDS regions 26 without the presence of the intermediate RSD regions 66 are achieved with the configuration shown in FIGS. 1A and 1B.

Fourth Preferred Embodiment

FIGS. 3A and 3B' shows a modification of the embodiment of FIG. 3B which has source/drain regions 69 formed in the active area 59 of the substrate 51 spaced away from the channel CH with the LDD/LDS extension regions 61' positioned between that channel CH and the source/drain regions 69, analogously to the embodiment shown by FIG. 1A but with the planar RSD regions of FIG. 3B. In this case, the studs 79 have cross sections which fit well within the boundaries of RSD regions 66 which are designed in accordance with this invention to have a much larger footprint which overlaps the extensions 61 thereby averting the problems associated with connection to the smaller footprint of the source/drain regions 69. The studs 79 have cross sections which fit well within the boundaries of RSD regions 66 which are designed in accordance with this invention to have a much larger footprint which overlaps the extensions 61' thereby averting the problems associated with connection to the smaller footprint of the source/drain regions 66. The studs 79 are formed on the top surface of the conductive cap layers 68 above the RSD regions 66, but reach to the right of the source/drain regions 69 in the active area 59 overlapping the LDD/LDS regions 61', which would be a problem if the RSD regions 66 and the conductive cap layers 68 did not extend beyond the footprints of the source/drain regions 69. Thus the dual advantages of providing a full rather than a partial contact area to the source/drain regions through the RSD regions 66 and avoidance of punchthrough if the studs 79 were directly above the LDD/LDS regions 61' are achieved with the configuration shown in FIGS. 3A and 3B'.

Process for Forming Device of First Preferred Embodiment

Figure 4:
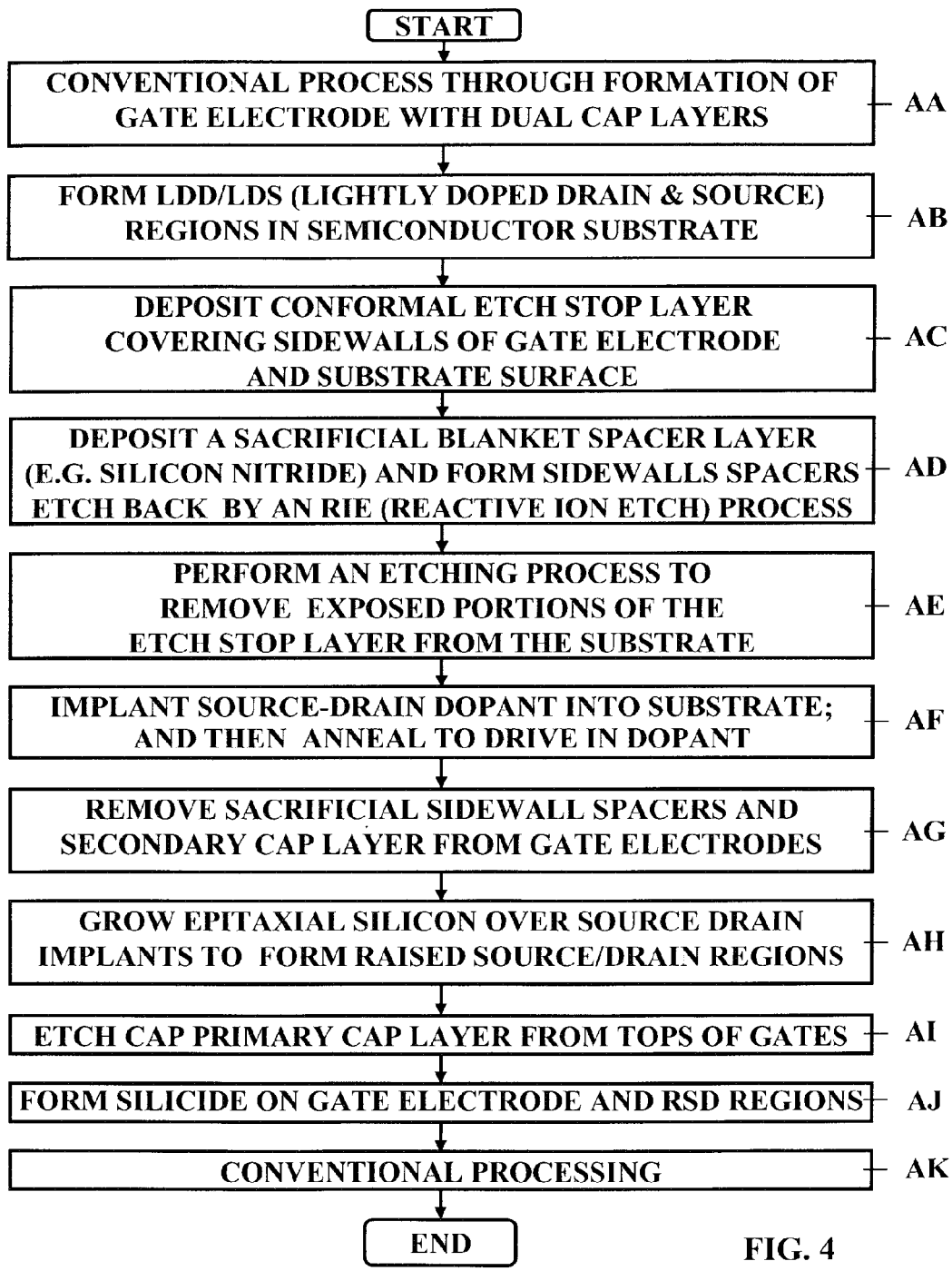
FIG. 4 is a flow chart of a process in accordance with this invention for forming the device of the first preferred embodiment shown in FIGS. 1A and 1B.

FIG. 4 is a flow chart of the process of forming the device 7 of the first preferred embodiment shown in FIGS. 1A and 1B. The process is illustrated by the views shown in the sectional front elevations of device 7 in various stages of manufacture in accordance with this invention shown by the elevational view of device 7 in FIGS. 5A-5K taken along line 5-5' shown in FIGS. 6A-6K, and the corresponding plan views of device 7 shown in FIGS. 6A-6K.

Step AA

Figure 5A:
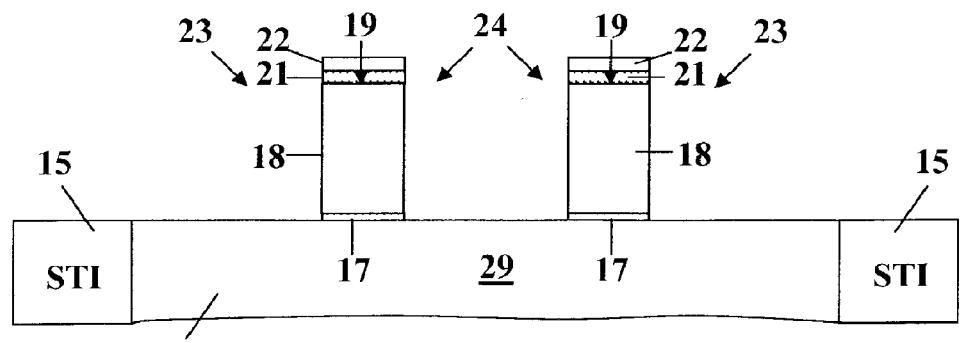
Figure 6A:
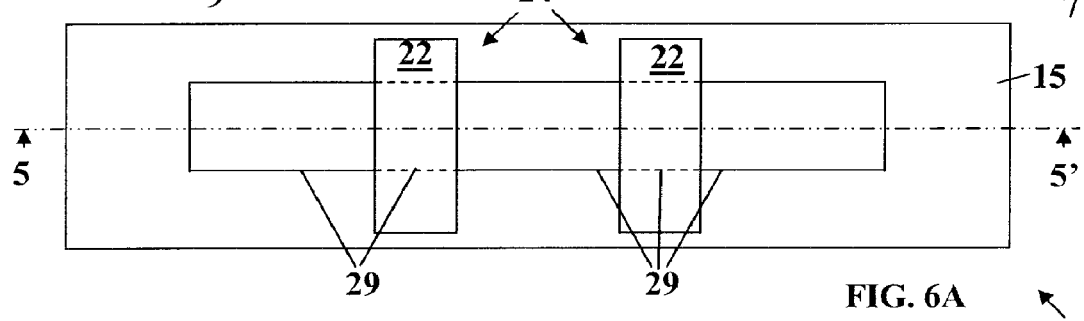

FIGS. 5A and 6A show the device 7 of FIGS. 1A and 1B in step AA which illustrates device 7 in an early stage of a manufacturing process, which has been conventional up to that stage. The process has included formation of two gate electrode stacks 24 of the two FETs 23 formed on the top surface of the semiconductor substrate 9. The gate electrode stacks 24 of the two FETs 23 extend from front to back across the active area 29. The active area 29 extends transversely from left to right. FIG. 5A shows the plan view of the rectangular shaped active area 29 in the lightly doped substrate 9 which extends from left to right and which is surrounded by the STI region 15. As can be seen in FIG. 6A, each of the stacks 24 includes dual cap layers comprising a primary cap layer 21 (preferably composed silicon oxide) formed on the top surface 19 of the gate electrode 18 and a secondary cap layer 22 (preferably composed of silicon nitride) formed on the top surface of the silicon oxide cap layer 21.

Step AB

Figure 5B:
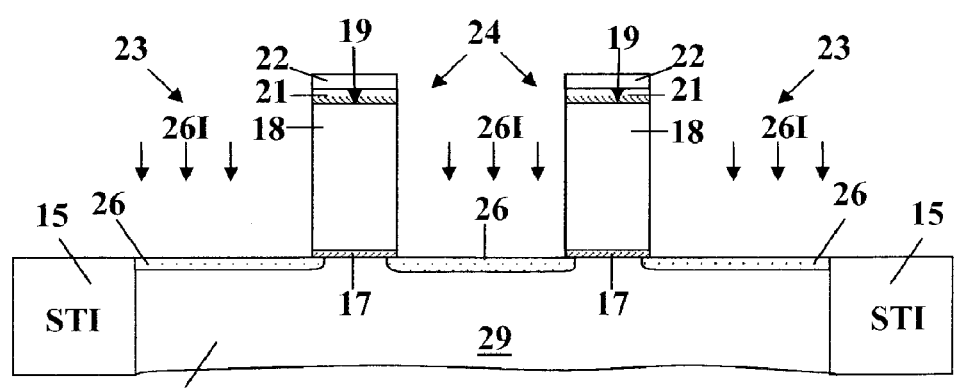
Figure 6B:
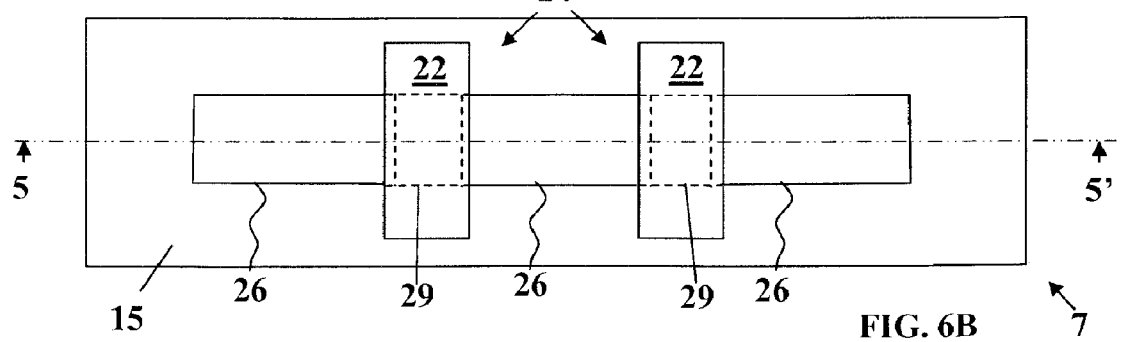

FIGS. 5B and 6B show the device 7 of FIGS. 5A and 6A after forming LDD/LDS extension regions 26 reaching from left to right in the top surface of the active area 29 with a central extension region 26 reaching across under the edges of the two gate electrode stacks 24 and each of a pair of extension regions 26 reaching from under the edge of one of the gate electrode stacks 24 respectively to the opposite left and right extremities of the STI region 15, using a conventional ion implantation process. In this step dopant ions 261 are implanted into the surface of the active area 29 of the substrate 9.

Step AC

FIGS. 5C and 6C show the device 7 of FIGS. 5B and 6B after depositing a conformal, thin film, etch-stop layer 28, with a thickness of about 50 Å to 200 Å, composed of the etch-stop dielectric (e.g. silicon oxide) described above. In the case of formation of silicon oxide the process employed is preferably a LTO (Low Temperature Oxide) deposition process which forms a film having a thickness from a minimum thickness of about 50Å to a maximum thickness of about 200 Å. The blanket etch-stop layer 28 covers sidewalls of the gate electrode and the surface of the substrate 9, the STI regions 15, as well as the nitride of the secondary cap layer 22, since the LTO (Low Temperature Oxide) is a deposition process where the oxide is formed over all surfaces.

Step AD

FIGS. 5D and 6D show the device 7 of FIGS. 5C and 6C after having deposited a blanket, sacrificial, spacer layer (composed of a material such as silicon nitride) over device 10 followed by etching back the silicon nitride thereby forming a set of conventional wide sidewalls spacers 33. Preferably the sacrificial, spacer layer comprises silicon nitride which is preferably etched back by an RIE (Reactive Ion Etching) process to form the sidewalls spacers 33 which are shown with tapered surfaces near the top thereof, adjacent to the primary and secondary cap layers 21/22.

Step AE

Figure 5E:
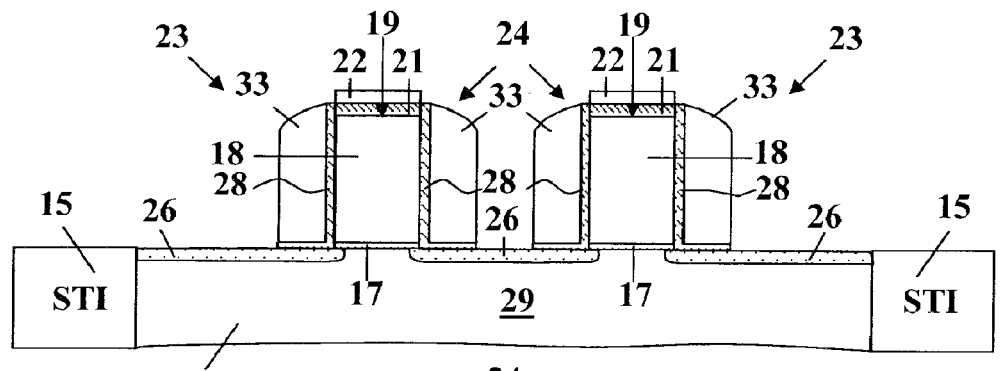
Figure 6E:
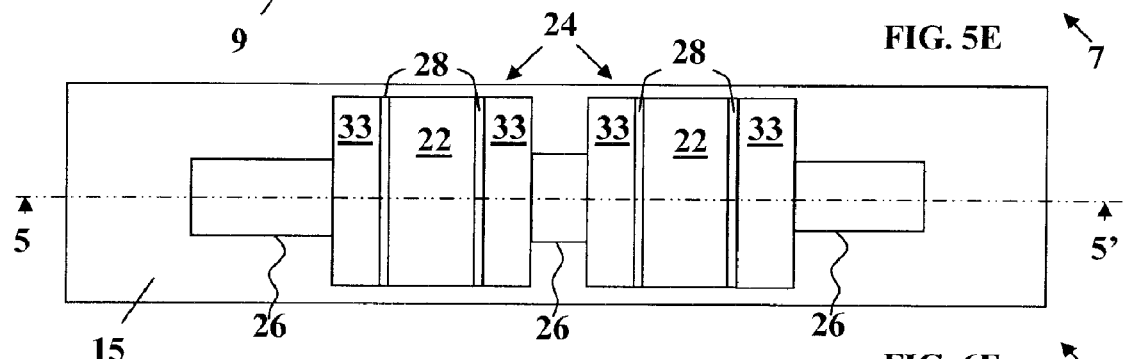

FIGS. 5E and 6E show the device 7 of FIGS. 5D and 6D after performing an etch-stop dielectric etching process. For example, if the etch-stop layer 28 comprises a an LTO layer of silicon oxide, then exposed portions of the silicon oxide etch-stop layer 28 can be etched away using a conventional etching process employed to remove silicon oxide, such as dilute hydrofluoric acid This etching process exposes the surface of the substrate 12 and top surfaces of the LDD/LDS regions 26 aside from the gate electrode stacks 24 and the sidewall spacers 33. The result of removal of the exposed portions of the etch-stop layer 28 is that a set of four L-shaped etch-stop dielectric structures 28 remain in place with dog leg shapes on the sidewalls of the gate electrode stacks 24. A long leg of each etch-stop dielectric structure 28 reaches up along a sidewall of one of the gate electrodes 18 and the shorter leg reaches away from the sidewall over the top surface of a narrow adjacent portion of the corresponding one of LDD/LDS extension regions 26.

Step AF

Figure 5F:
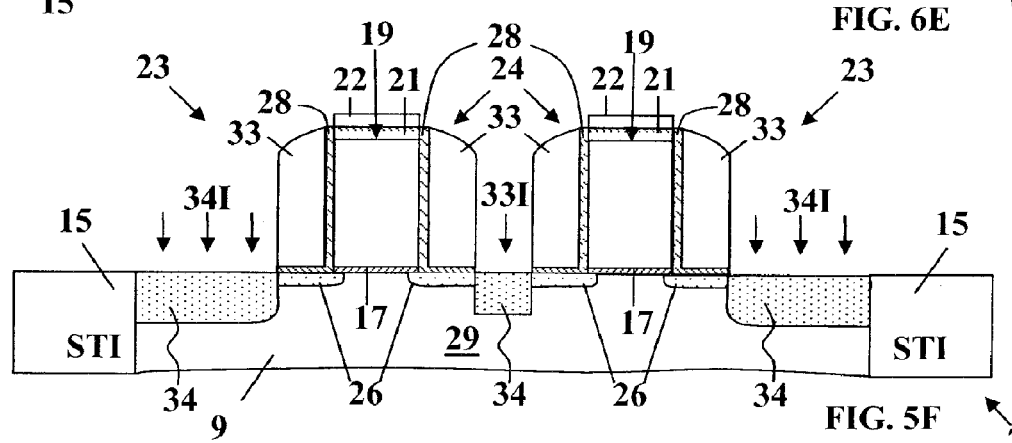
Figure 6F:
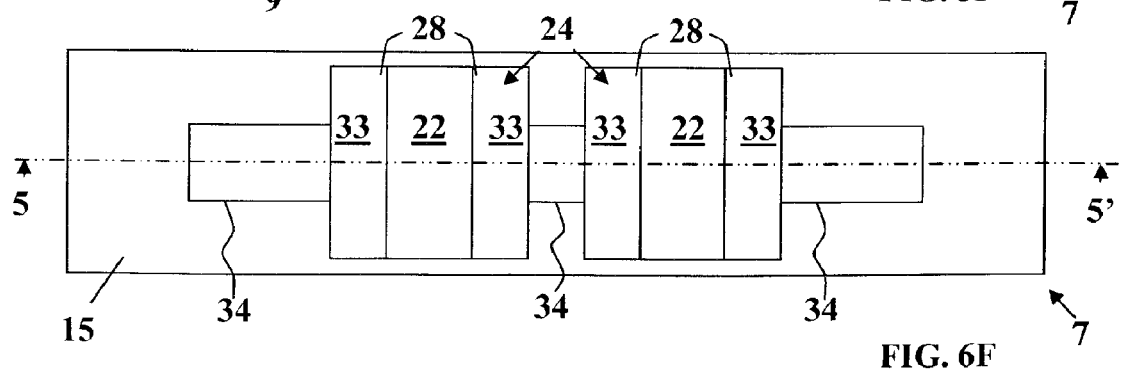

FIGS. 5F and 6F show the device 7 of FIGS. 5E and 6E after performing the optional step of implantation of source/drain dopant 34I into the substrate 9 to form source-drain regions 34 in the active area 29 of substrate 9 aside from and aligned with the sacrificial, sidewall spacers 33. As is conventional, this step of doping increases the depth and concentration of the dopant where the LDD/LDS extensions are exposed aside from the sacrificial, sidewall spacers 33. Then follows a step of annealing to drive the dopant into the source drain regions 32 formed in the substrate 12.

In the case of the embodiment of FIG. 1A'/1B' the LDD/LDS extension regions 26 remain as they are on top of the substrate 9 prepared for step AH and step AF is skipped.

Step AG

Figure 5G:
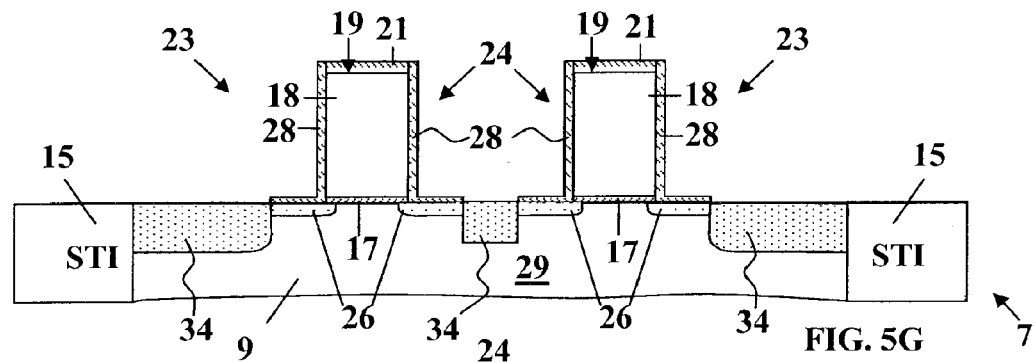
Figure 6G:
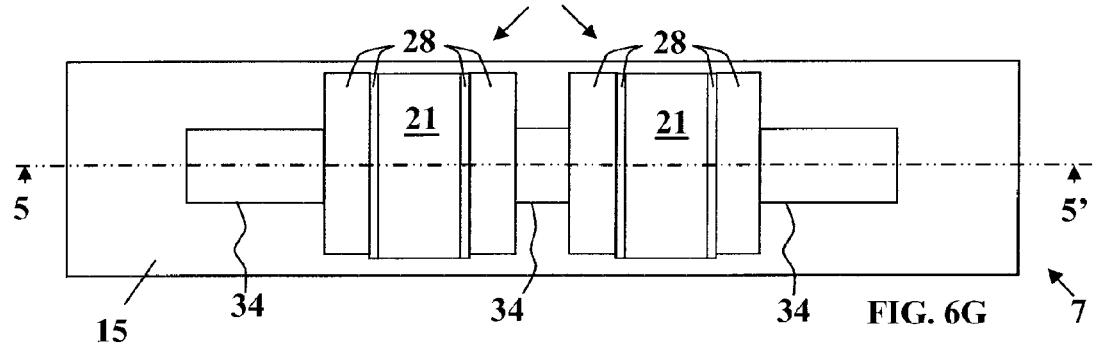

FIGS. 5G and 6G show the device 7 of FIGS. 5F and 6F after removing the, sacrificial sidewall spacers 33 from the sidewalls of the conformal etch-stop layer 28 on the sidewalls of the gate electrodes 18 exposing the remainder of the L-shaped, conformal etch-stop layer 28, which remain in place covering the sidewalls of the gate electrodes 18 and the LDD/LDS extension regions 26. If the sidewall spacers 33 are composed of silicon nitride they can be removed by etching with hot phosphoric acid or other nitride etchants. Step AG is also performed to remove the secondary cap layer 22 from the top of primary cap layer 21.

Step AH

Figure 5H:
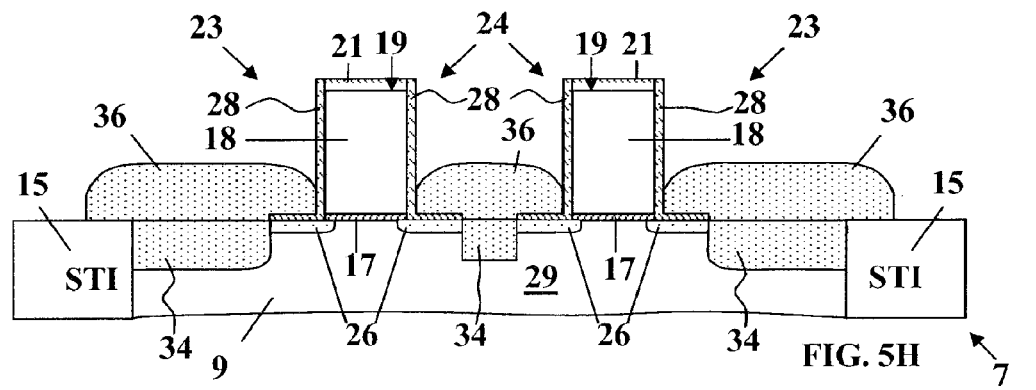
Figure 6H:
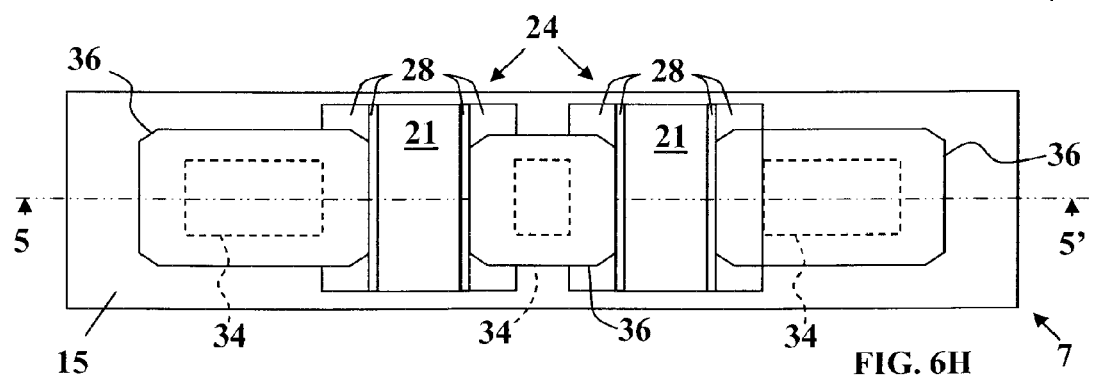

FIGS. 5H and 6H show the device 7 of FIGS. 5G and 6G after growing the three doped, epitaxial silicon RSD regions 36 over the source/drain implanted regions 34. In the case of the embodiment of FIG. 1A'/1B' the RSD regions 36 are grown over the LDD/LDS extension regions 26.

Step AI

Figure 5I:
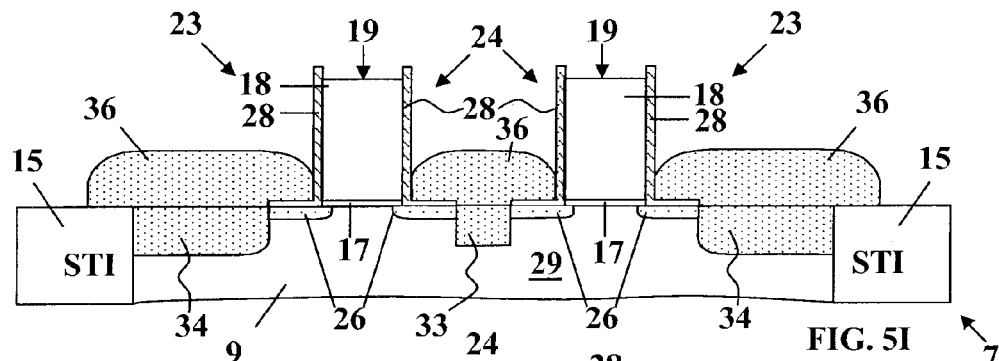
Figure 6I:
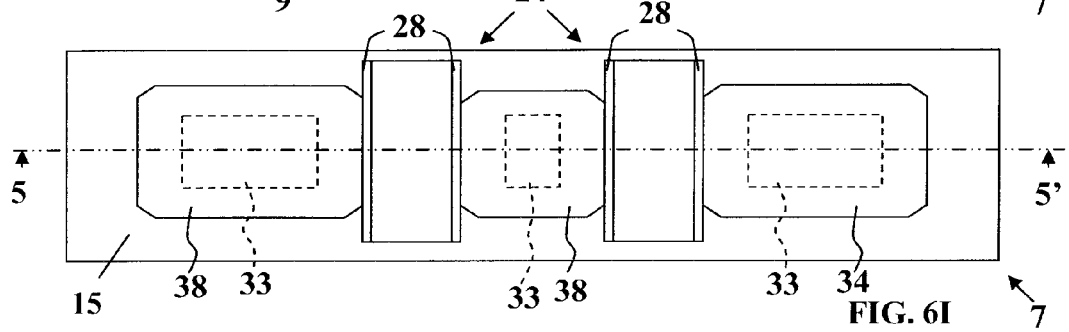

FIGS. 5I and 6I show the device 7 of FIGS. 5H and 6H after the etching the primary cap layer 21 (e.g. silicon oxide) away from top surfaces 19 of gate electrodes 18

Step AJ

Figure 5J:
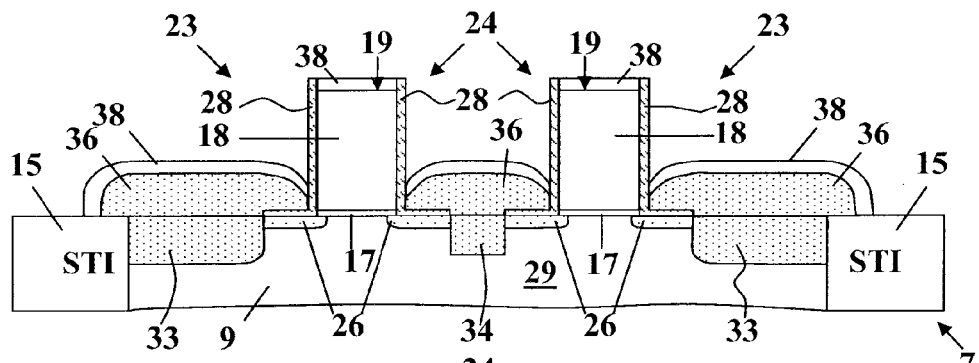
Figure 6J:
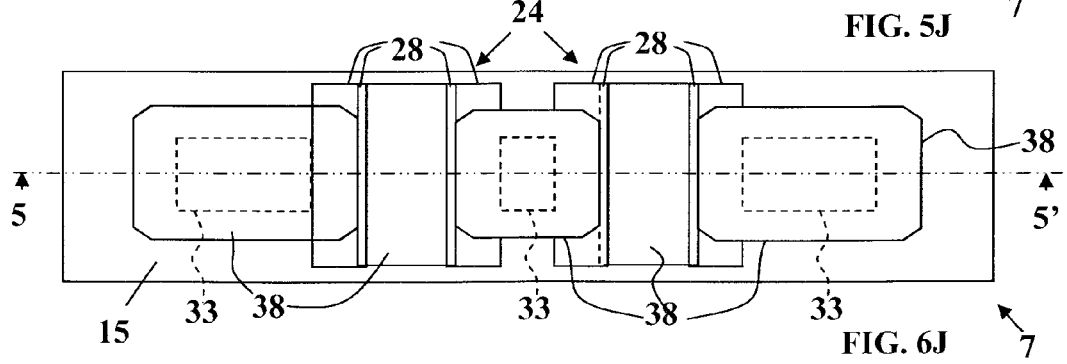

FIGS. 5J and 6J show the device 7 of FIGS. 5I and 6I after formation conductive cap layers 38 (e.g. metal silicide layers) on top surfaces 19 of the gate electrodes 18 and RSD regions 36.

Step AK

Figure 5K:
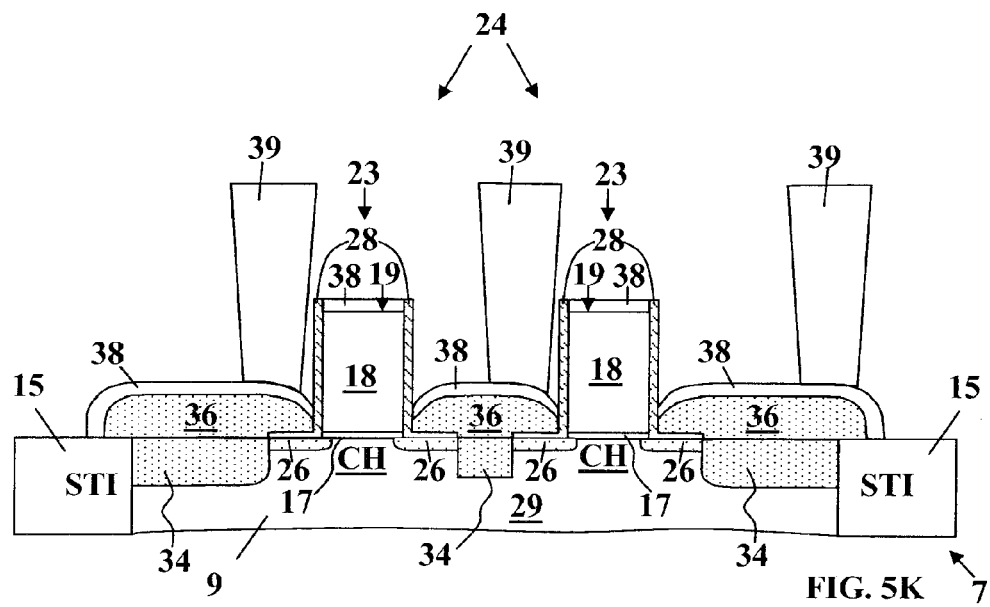
Figure 6K:
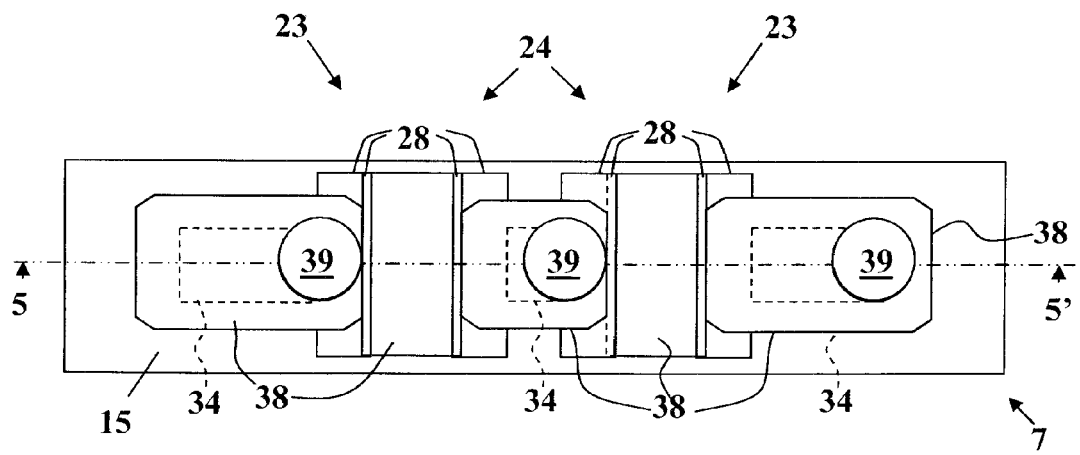

FIGS. 5K and 6K show the device 7 of FIGS. 5J and 6J which exemplify the conventional processing steps including the formation of studs 39 connected to the conductive cap layers 38 formed on top of the RSD regions 36. It should be noted that the studs 39 are not properly aligned with the source/drain regions 34 since they extend across the extensions 26 on the left and in the center of the device 7, as can be seen in FIG. 5K, which is unacceptable since the studs 39 might contact the extensions 26. The studs 39 are not well aligned therewith due to the problems of location of via holes for the studs 39 in the intermediate structure (not shown for convenience of illustration.). On the other hand, the studs 39 have cross sections that fit within the RSD regions 36 which are designed in accordance with this invention to overlap the extensions thereby averting the problem of the small footprint of the source/drain regions 34.

Figure 7A:
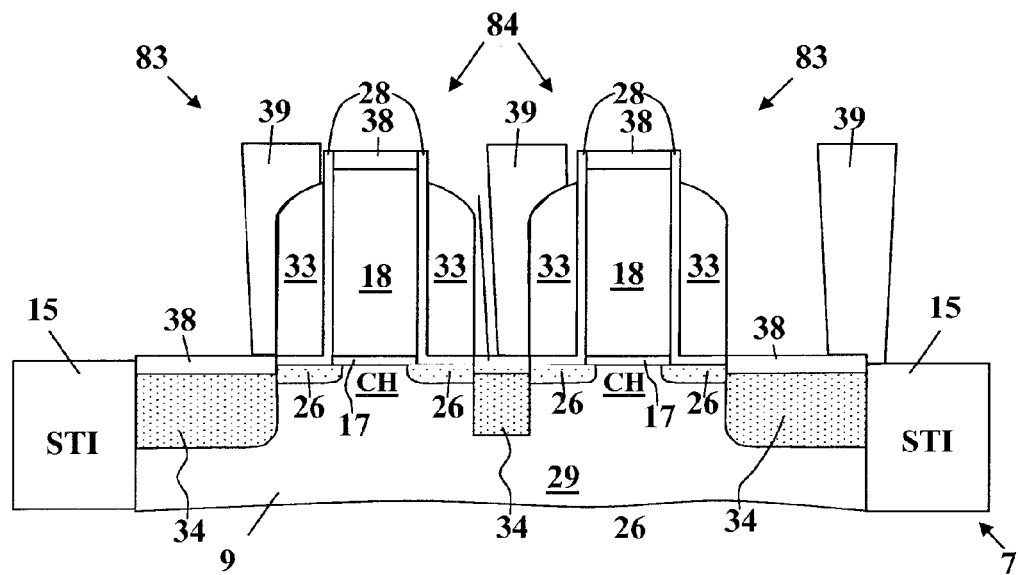
FIG. 7A is a front, elevational, sectional view taken along line A-A' in FIG. 7B of prior art CMIS/CMOS semiconductor device including a pair of FET devices with conventional sidewall spacers including no RSD regions. device.
Figure 7B:
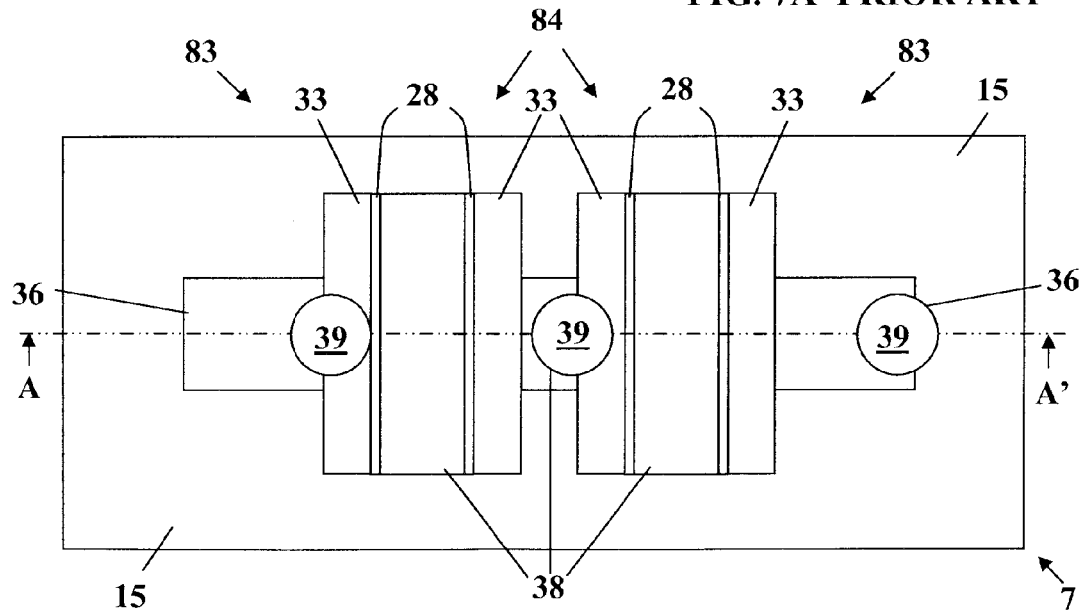
FIG. 7B is a plan view of the prior art device of FIG. 7A.

FIGS. 7A and 7B show a prior art device 7 with a pair of FET devices 83 in which similar reference numbers refer to similar structures to those shown in FIGS. 1A and 1B. FIG. 7A shows a front, elevational, sectional view taken along line A-A' in FIG. 7B of a prior art type of CMIS/CMOS, FET, semiconductor device 7 with conventional sidewall spacers 33, but it includes no RSD regions. FIG. 7B is a plan view of the device 7 of FIG. 7A.

Referring to FIG. 7A, the prior art semiconductor device 7 is formed on a lightly doped, monocrystalline semiconductor substrate 9 in which lateral Shallow Trench Isolation (STI) regions 15 have been formed defining an active area 29. The STI regions 15 surround two FET devices 83 which include a pair of gate electrode stacks 84 with channel regions CH therebelow in the active area 29. Each gate electrode stack 84 includes a gate dielectric layer 17 formed on the surface of the substrate 9 above the channel CH of that FET device 23, a gate electrode 18 (with vertically oriented sidewalls) formed over the gate dielectric layer 17, and a conductive cap layer 38 formed on top of the gate electrode 18. Lightly doped source/drain (LDD/LDS) extension regions 26 are formed in the active area 29 of the substrate 9 aligned with the sidewalls of the gate electrodes 18 and generally aside therefrom. The gate dielectric layer 17 is composed of a dielectric material. A conformal, thin, etch-stop layer 28 with an L-shaped cross-section (shaped like a dog leg) as seen in FIG. 1A is formed on the sidewalls of the gate electrodes 18 and with a lower portion of the dog leg over the LDD/LDS extension regions proximate to the channels CH. However unlike the embodiment of this invention, as shown by FIGS. 1A and 1B, etc., there are conventional sidewall spacers 33 formed on the sidewalls and lower leg of the etch-stop layer 28. While the LDD/LDS extension regions 26 are formed in the active area 29 aside from the sidewalls of the gate electrodes 18, generally aligned therewith, the more heavily doped source/drain regions 34 are formed in the active area 29 spaced away from the sidewalls of the gate electrodes 18 by the distance that has been provided by processing with the conventional sidewall spacers 33, as will be well understood by those skilled in the art. Unlike the embodiment of FIGS. 1A and 1B there are no RSD regions. Thus the footprint of the source/drain regions 34 formed in the active area 29 of substrate 9 is substantially smaller than the footprint of the RSD regions 36 and the conductive cap layer 38 of FIGS. 1A and 1B and FIGS. 5K and 6K. Again, a set of three metal studs 39 is shown, with each one connected to one of the conductive cap layers 38. It should be noted that the three studs 39 are not well aligned with the source/drain regions 34 due to the problems of location of via holes for the studs 39 in the intermediate structure (not shown for convenience of illustration). The problems associated with connection to the smaller footprint of the source/drain regions 34 are manifest, since there are no RSD regions 36. The studs 39 are formed on the top surface of the conductive cap layers 38 above the source drain regions 34, but reach to the right of the source/drain regions 34 in the active area 29 overlapping the two leftmost spacers 39 LDD/LDS regions 26 with the spacers 33 on the left of the gate electrodes 18 narrowing the studs to half their size, reducing contact area. As to the stud on the right which overlaps the STI region 15, there is the problem that the stud reaches beyond the edge of its conductive cap layer 38 over the STI region 15, the reducing its contact area as well. Thus the disadvantages of providing only partial contact area to the source/drain regions 34 are manifested by this prior art embodiment.

The plan view of the prior art CMIS/CMOS FET semiconductor device 7 shown in FIG. 7B shows the smaller surface area of the source/drain regions 34 as contrasted with the RSD area shown in FIG. 1B and FIG. 6K showing the larger degree of separation provided by the etch-stop layers 28 and sidewall spacers 33 between the gate electrodes 18 and the source/drain regions 34 and conductive cap layer 38 thereabove.

Figure 8A:
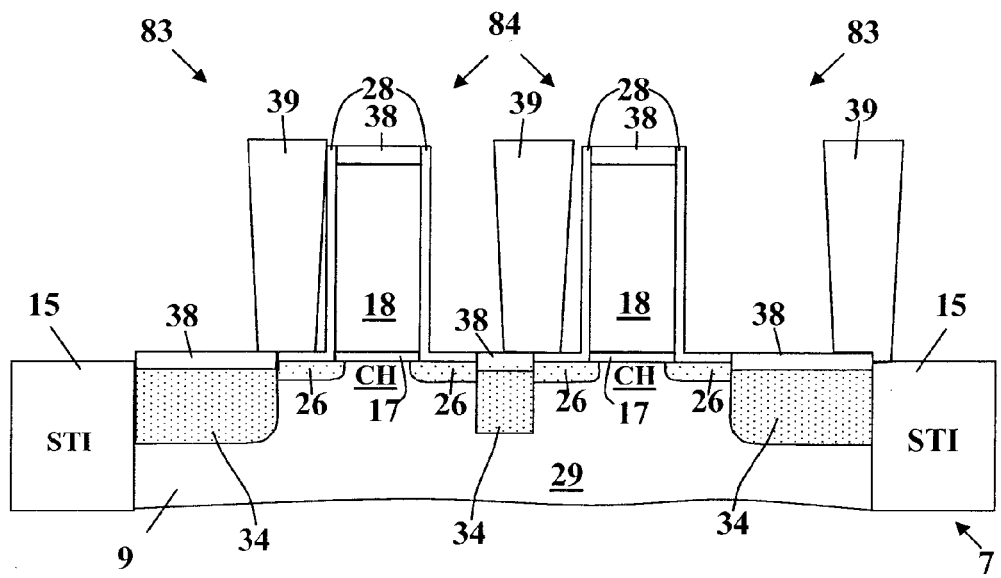
FIGS. 8A and 8B show a prior art device, which comprises a modification of the device of FIGS. 7A and 7B.
Figure 8B:
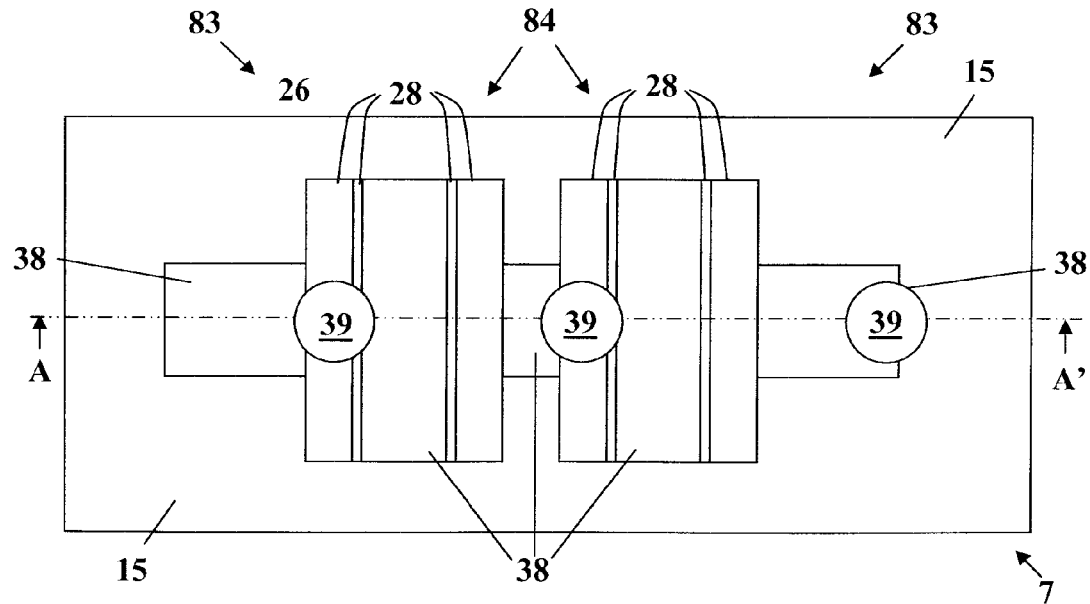

FIGS. 8A and 8B show a prior art modification of the device 7 shown in FIGS. 7A and 7B in which similar reference numbers refer to similar structures. FIG. 8A shows a front, elevational, sectional view, taken along line A-A' in FIG. 8B of device 7, which is formed without sidewall spacers and without RSD regions. FIG. 8B is a plan view of the device 7 of FIG. 8A. Otherwise it is identical to device 7 of FIGS. 7A and 7B and has the same problems of having a substantially smaller footprint for the source/drain regions 34 and the conductive cap layer 38 thereabove as compared with the footprint of the RSD regions 36 and the conductive cap layer 38 of FIGS. 1A and 1B, and FIGS. 5K and 6K. Again, a set of three metal studs 39 is shown, with each one connected to one of the conductive cap layers 38. It should be noted that the three studs 39 are not well aligned with the source/drain regions 34 because of the problems of location of via holes for the studs 39 in the intermediate structure (not shown for convenience of illustration). The problems associated with connection to the smaller footprint of the source/drain regions 34 are manifest, since there are no RSD regions 36. The studs 39 are formed on the top surface of the conductive cap layers 38 above the source drain regions 34, but reach to the right of the source/drain regions 34 in the active area 29 overlapping the two leftmost spacers 39 LDD/LDS regions 26 with the spacers 33 on the left of the gate electrodes 18 narrowing contact of all three of the studs 39 to the conductive cap layers 38 in half thus severely reducing contact area. As to the right hand stud 39 which overlaps the STI region 15, there is the problem that the stud 39 reaches beyond the edge of its conductive cap layer 38 over the STI region 15, the reducing its contact area as well. Thus the disadvantages of providing only partial contact area to the source/drain regions 34 are manifest in this embodiment without any sidewall spacers.

FIGS. 9A-9C show a prior art CMIS/CMOS, FET, semiconductor device 7 in which similar reference numbers refer to similar structures to those shown in FIGS. 1A and 1B with a single FET device 93 sidewall spacers 33 and without RSD regions. FIG. 9A is a plan view of the device 7. FIG. 9B shows a front, elevational, sectional view of the prior art device 7, taken along line B-B' in FIG. 9A, which has the sidewall spacers 33 but which does is shown without RSD regions. FIG. 9C is a right elevation taken along line C-C' in FIG. 9A of the device 7.

Referring to FIG. 9B, the prior art semiconductor device 7 is formed on a lightly doped, monocrystalline semiconductor substrate 9 in which a peripheral Shallow Trench Isolation (STI) region 15 has been formed defining an active area 29. The STI region 15 surrounds the FET devices 93 which include a pair of gate electrode stacks 94 with channel regions CH therebelow in the active area 29. Each gate electrode stack 94 includes a gate dielectric layer 17 formed on the surface of the substrate 9 above the channel CH of that FET device 93, a gate electrode 18 (with vertically oriented sidewalls) formed over the gate dielectric layer 17. A conductive cap layer 38 overlies the top of the gate electrode 18. Lightly doped source/drain (LDD/LDS) extension regions 26 are formed in the active area 29 of the substrate 9 aligned with the sidewalls of the gate electrodes 18 and generally aside therefrom. The gate dielectric layer 17 is composed of a dielectric material. A conformal, thin, etch-stop layer 28 with an L-shaped cross-section is formed on the sidewalls of the gate electrodes 18 and with a lower portion extending over the LDD/LDS extension regions proximate to the channels CH.

However, unlike the embodiment of this invention shown by FIGS. 1A and 1B, as shown by FIG. 9B etc., there are conventional sidewall spacers 33 formed on the sidewalls and lower leg of the etch-stop layer 28. While the LDD/LDS extension regions 26 are formed in the active area 29 aside from the sidewalls of the gate electrodes 18 and generally aligned therewith, the more heavily doped source/drain regions 34 are formed in the active area 29 spaced away from the sidewalls of the gate electrodes 18 by the distance which has been provided by processing with the conventional sidewall spacers 33, as will be well understood by those skilled in the art. Unlike the embodiment of FIGS. 1A and 1B there are no RSD regions. Thus, the footprint of the source/drain regions 34 formed in the active area 29 of the substrate 9 is substantially smaller than the footprint of the RSD regions 36 and the conductive cap layer 38 of FIGS. 1A and 1B and FIGS. 5K and 6K. The stud 39 to the left of the spacer 33 and the gate electrode stack 94 in FIG. 9B contacts a narrow portion of the conductive cap layer over the leftmost source/drain region 34 which increases resistance at the contact since the remainder of the stud 39 is in contact with the spacer 33 which comprises and electrical insulator.

FIG. 9B shows the metallic, conductive cap layer 38 above the gate electrode stack 94, surrounded by the etch-stop layer 28 and the sidewall spacers 33. The metal silicide layers 38 above the surfaces of the source/drain regions 34 are shown extending laterally from the sides of the sidewall spacers 33.

FIG. 9C shows the STI regions 15 on either side of the channel CH formed in the active area 29 of substrate 9. The gate electrode 18 of the gate electrode stack 94 of the device 93 extends across both the upper and lower portions of the STI region 15 and the gate dielectric layer 17. The etch-stop layer 28 and the spacer 33 are shown on the bottom end of the gate electrode 18 where it ends over the lower portion of the STI region 15.

In FIGS. 9A and 9B it is shown that case each of a pair of metal studs 39 is connected to a conductive cap layer 38. It should be noted that the two studs 39 are not well aligned with the source/drain regions 34 due to the problems of location of via holes for the studs 39 in the intermediate structure (not shown for convenience of illustration). The problems associated with connection to the smaller footprint of the source/drain regions 34 are manifest, since there are no RSD regions 36. The studs 39 are formed on the top surface of the conductive cap layers 38 above the source drain regions 34, but reach to the right of the source/drain regions 34 in the active area 29 overlapping the leftmost spacers 33 over the LDD/LDS region 26 with the spacer 33 on the left of the gate electrodes 18 narrowing the stud to half size, thereby reducing contact area. Although the right hand stud 39 appears to present a reduced problem since the right hand stud 39 does not reach beyond the edge of its conductive cap layer 38, the disadvantages of providing only partial contact area of the left hand stud 39 conductive cap layers 38 over a source/drain region 34 is manifested by this prior art embodiment.

Figures 10A, 11A:
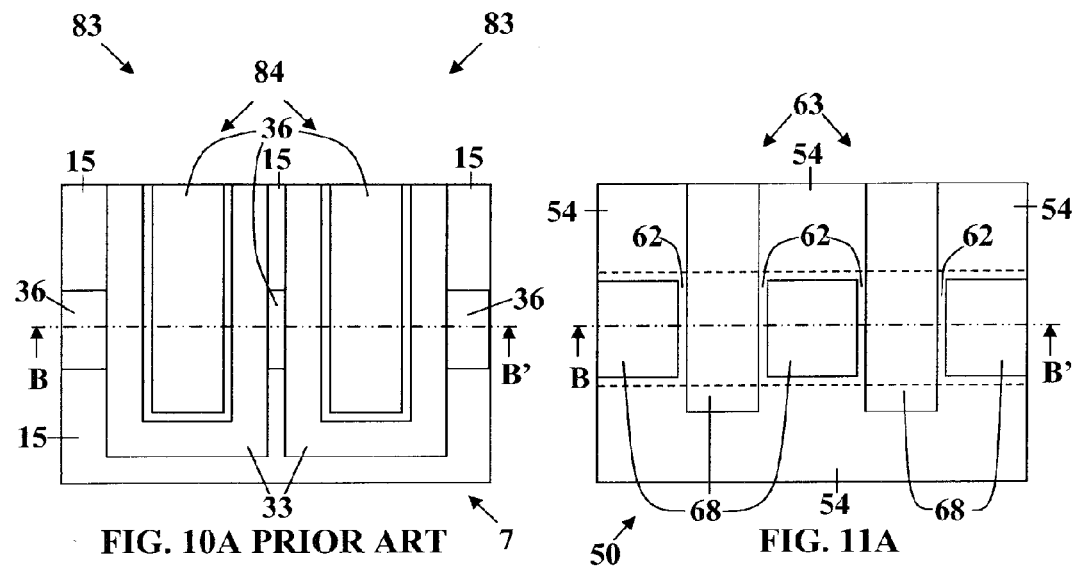
FIGS. 10A and 10B are reduced scale plan and front elevation versions of the prior art device of FIGS. 8A and 8B which are positioned side by side with FIGS. 11A and 11B. FIG.
FIGS. 11A and 11B show a fifth embodiment of this invention, which are plan and front elevation views which show a fifth embodiment of this invention, which is a modification of the fourth embodiment shown in FIGS. 3A and 3B'.
Figures 10B, 11B:
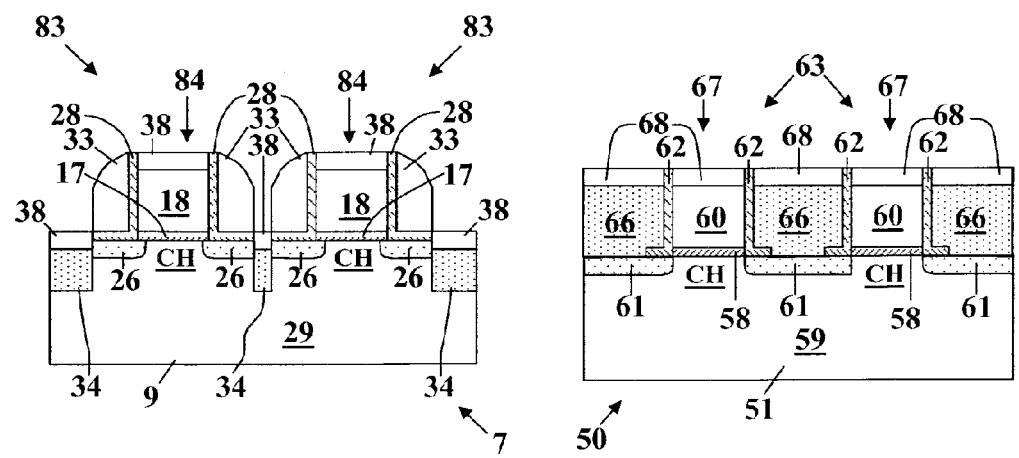

FIGS. 10A and 10B are reduced scale plan and front elevation versions of the prior art device shown in FIGS. 8A and 8B. FIG. 10A is a plan view of the prior art device 7 of FIG. 8A and FIG. 10B is a section taken along line B-B' in FIG. 10A.

FIGS. 11A and 11B, which show a fifth embodiment of this invention, are plan and front elevation views of a modification of the fourth embodiment shown in FIGS. 3A and 3B. FIGS. 11A and 11B are positioned side by side with FIGS. 10A and 10B to provide a comparison therewith. FIG. 11A is a plan view and FIG. 11B is a section taken along line B-B'.

FIG. 11A is a plan view of the device 50 which is a modification of the fourth embodiment shown in FIG. 3A. FIG. 11B is a section taken along line B-B' in FIG. 11A.

The teachings of FIGS. 11A and 11B are explained below with reference to the flowchart of FIG. 12 and to the process details illustrated in detail by FIGS. 13A-13O, FIGS. 14A-14O, and FIGS. 15A-15O. As can be seen the sidewall spacers 33 in FIG. 10B as well as FIG. 10A, the separate the source/drain regions 34 and conductive layers 38 from the gate electrode 18 and have small footprints. On the other hand the two FET devices 63 with gate electrode stacks 67 are juxtaposed with the raised source/drain regions 66 topped by conductive cap layers 68 on either side of the L-shaped etch-stop layers 62. No studs are shown on this sheet of drawings for convenience and clarity of illustration of the comparative geometries of the underlying structures.

Figure 12:
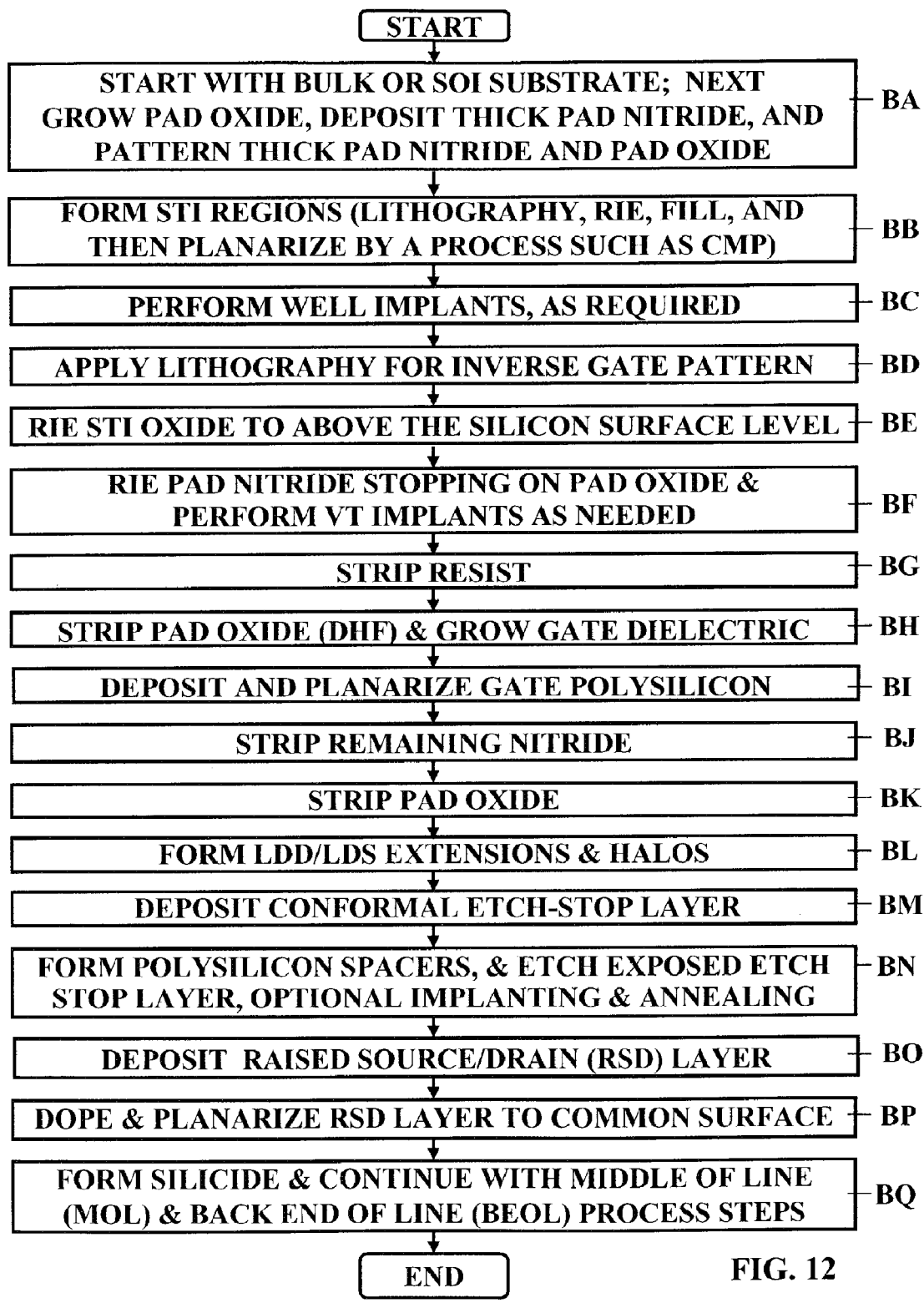
FIG. 12 is a flow chart of the process of manufacture of a device in accordance with the third embodiment of this invention shown in FIGS. 3A, 3B, and 3C.

FIG. 12 is a flow chart of the process of manufacture of a device 50 in accordance with the third embodiment of this invention shown in FIGS. 3A, 3B, and 3C.

FIGS. 13A-13Q show plan views of the device 50 of FIGS. 3A, 3B and 3C being manufactured in accordance with the process of FIG. 12.

FIGS. 14A-14Q show front elevational views of the device 50 of FIGS. 3A, 3B and 3C taken along line 14-14' in corresponding FIGS. 13A-13Q of the device 50 which is shown being manufactured step by step in accordance with the process of FIG. 12.

FIGS. 15A-15Q show side elevational views of the device 50 of FIGS. 3A, 3B and 3C taken along line 15-15' in corresponding FIGS. 13A-13Q of the device 50 which is shown being manufactured step by step in accordance with the process of FIG. 12.

Step BA

Referring to FIGS. 13A, 14A, and 15A, start with a substrate 51, e.g. bulk or Silicon on Insulator (SOI). Next grow pad oxide layer 52 on the top surface of substrate 51. Then deposit a blanket thick pad nitride layer 53 over pad oxide layer 52. Next the process continues by patterning the thick pad nitride layer 53 and the pad oxide layer 52 with a photoresist mask (not shown for convenience of illustration) followed by etching.

Step BB

Referring to FIGS. 13B, 14B and 15B taking the result from step BA, form a bifurcated STI region 54 by forming a patterned lithographic mask (not shown for convenience of illustration), etching in the pattern of the mask to form an STI trench by Reactive Ion Etching (RIE), filling the trench with an STI dielectric 54 (e.g. $SiO_2$) forming a bifurcated shape in FIG. 13B, and then planarizing, e.g. by Chemical Mechanical Planarization (CMP). This leaves a transverse portion of the thick pad nitride layer 53 and the pad oxide layer 52 extending from the right edge of device 50 in FIG. 13C to near the left edge, with the STI region surrounding the rectangular shape of the pad layers 53/52 in FIG. 13B. The pad layers 53/52 are also shown in FIG. B sandwiched between portions of the STI region 54. The active area 59 of the substrate 51 is shown to the left of the STI region 54 in FIG. 14B and between the sides of the STI region 54 in FIG. 15B.

Step BC

Referring to FIGS. 13C, 14C and 15C taking the result from step BB, perform well implants (not shown) in device 50, as required.

Step BD

Referring to FIGS. 13D, 14D, and 15D taking the result from step BC, a photolithographic mask 56 with a window 56W therethrough is applied over major portions of the STI region 54 and a portion of the thick pad layer 53 to form an inverse gate pattern.

Step BE

Figure 13E:
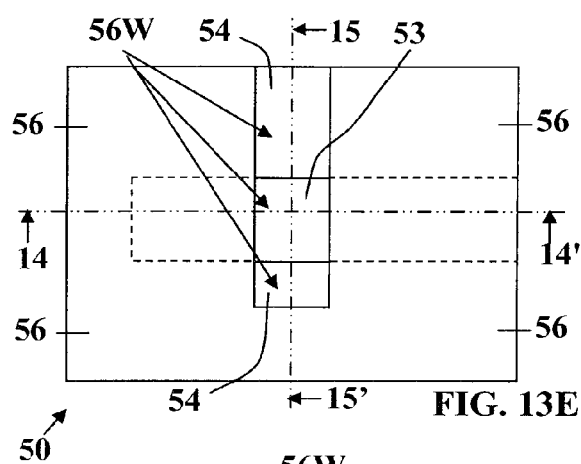
FIGS. 13A-13Q show plan views of the device of FIGS. 3A, 3B, and 3C being manufactured in accordance with the process of FIG. 12.
Figure 15E:
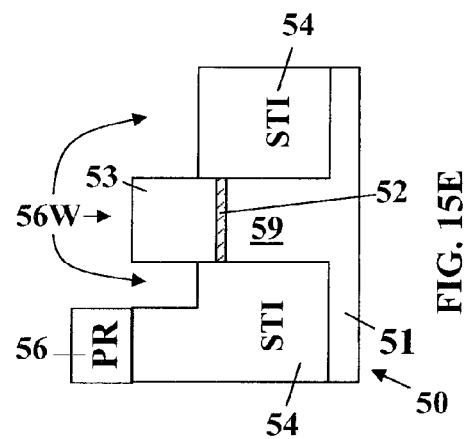
FIGS. 15A-15Q show side elevational views of the device of FIGS. 13A-13Q taken along line 15-15' in corresponding FIGS. 13A-13Q of the device which is shown being manufactured step by step in accordance with the process of FIG. 12.
Figure 14E:
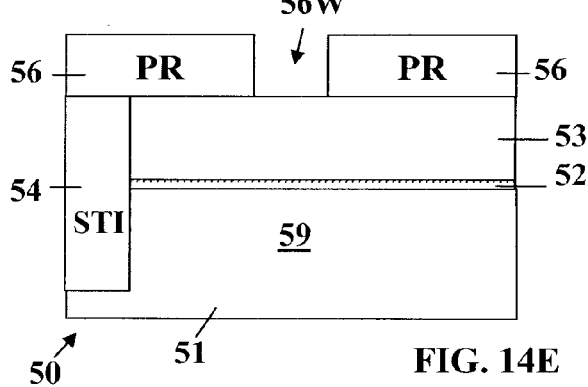
FIGS. 14A-14Q show front elevational views of the device of FIGS. 13A-13Q taken along line 14-14' in corresponding FIGS. 13A-13Q of the device which is shown being manufactured step by step in accordance with the process of FIG. 12.

Referring to FIGS. 13E, 14E and 15E taking the result from step BD, perform an etching step, e.g. etching by an RIE process to etch back the silicon oxide of the exposed portions of the STI region 54 to above the top surface level of the substrate 51, e.g. silicon as can be seen in FIG. 15E. Thus a notch is formed in the bifurcated STI region 54 where the window 56W crosses thereover.

Step BF

Figure 13F:
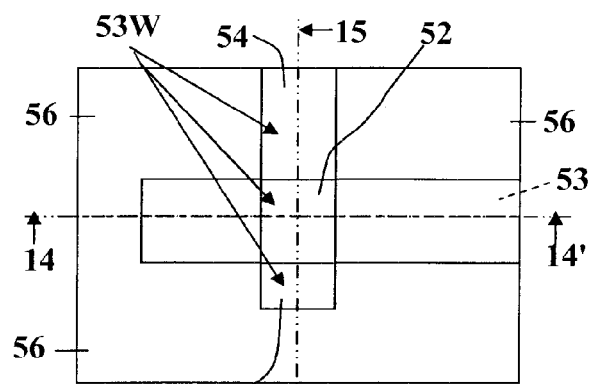
Figure 15F:
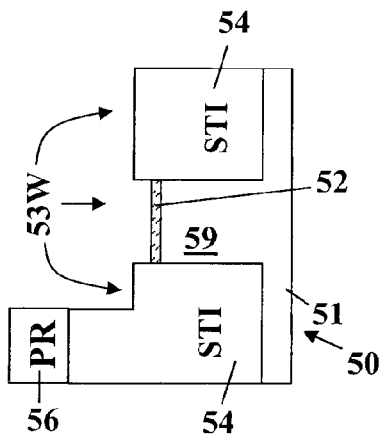
Figure 14F:
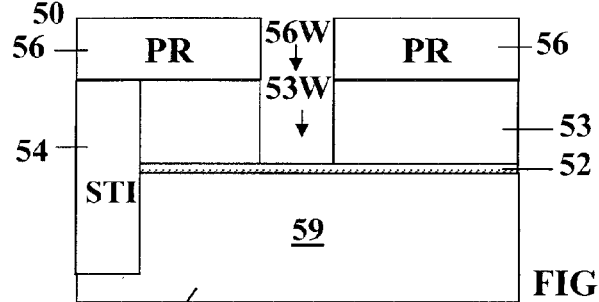

Referring to FIGS. 13F, 14F and 15F taking the result from step BE, with the mask 56 remaining in place, etch down through the window 56W forming a gate electrode window 53W in the pad nitride layer 53. In other words the portions of the remainder of pad nitride layer 53 exposed through window 56W are removed, e.g. by an RIE process, stopping on the pad oxide layer 52. Then Vt implants into the active area 59 of the substrate 51 are performed as needed.

STEP BG

Figure 13G:
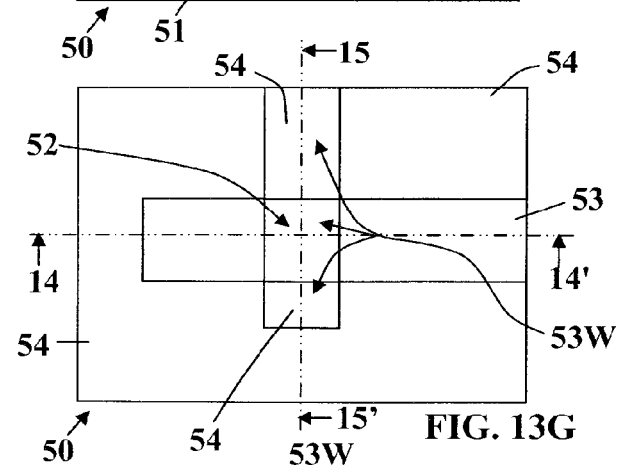
Figure 15G:
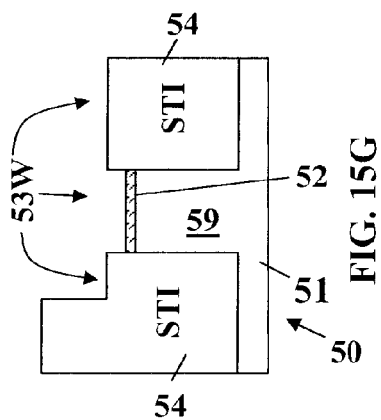
Figure 14G:
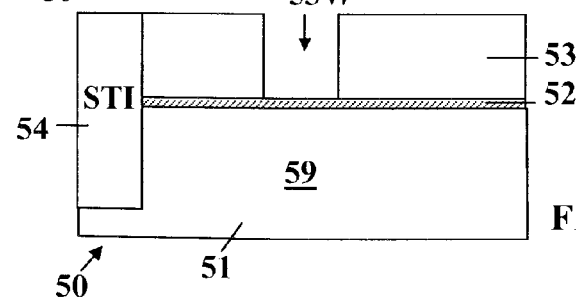

Referring to FIGS. 13G, 14G, and 15G taking the result from step BF, the photoresist mask 56 is removed using conventional stripping techniques. This leaves the gate electrode window 53W in the pad nitride layer 53 extending down to the pad oxide layer 52 and exposes surfaces of the STI regions which were covered by the mask 56.

Step BH

Referring to FIGS. 13H, 14H and 15H taking the result from step BG, strip pad oxide layer 58 at the bottom of the window 53W using an etching technique, e.g. a Dilute HydroFluoric (DHF) acid etching process. Then grow a gate dielectric layer on the exposed, top surface of the active area 59 of the substrate 51 reaching across between sides of the STI region 54 as shown in FIG. 15H. The pad oxide layer 52 remains below the pad silicon nitride 53 as seen in FIG. 14H aside from the window 53W.

Step BI

Figure 13J:
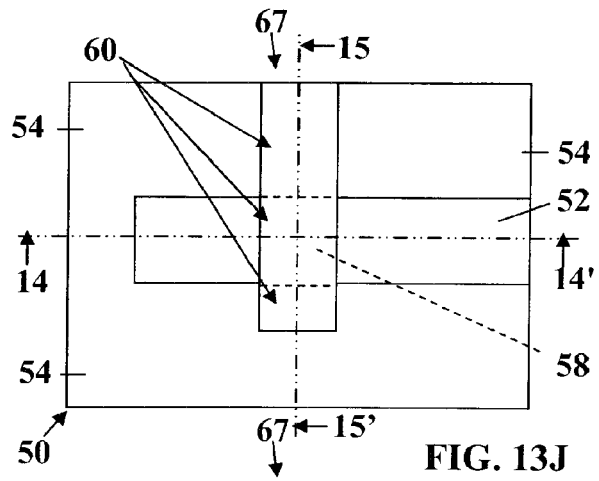
Figure 15J:
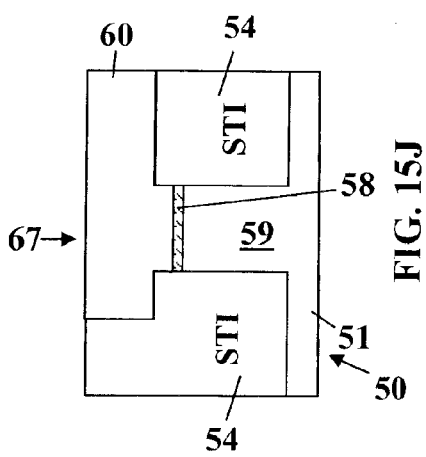
Figure 14J:
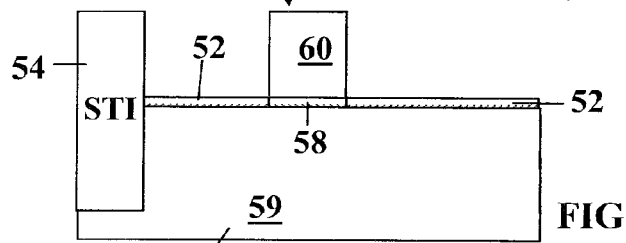

Referring to FIGS. 13I, 14I, and 15I taking the result from step BH, a blanket layer of the material for the gate electrode 60 is deposited and planarized. Preferably, the gate electrode 60 is composed of polysilicon which has been doped to form an electrical conductor. As can be seen, the gate electrode 60 fills the window 53W between the two sides of the pad silicide layer in FIG. 13I and covering the recessed portions of the STI region 54 in FIG. 15I. The gate electrode 60 and the gate dielectric 58 form the gate electrode stack 67 located between the two sides of the STI region 54 as shown by FIG. 15I and between the two sides of the pad silicon nitride layer 53 as shown by FIG. 13I Step BJ Referring to FIGS. 13J, 14J and 15J taking the result from step BI, the remaining portions of the pad silicon nitride layer 53 leaving the gate electrode stack 67 and the extensions of the gate electrode over the STI region intact and the sidewalls thereof exposed in FIG. 14J. Note that the remaining portions of the pad oxide layer 52 are now exposed.

Step BK

Figure 13K:
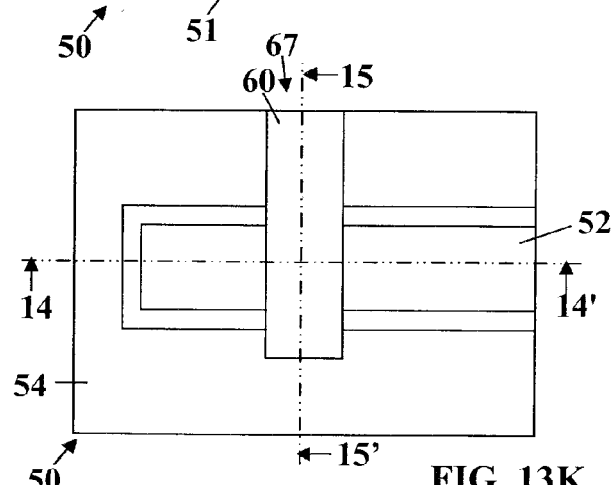
Figure 15K:
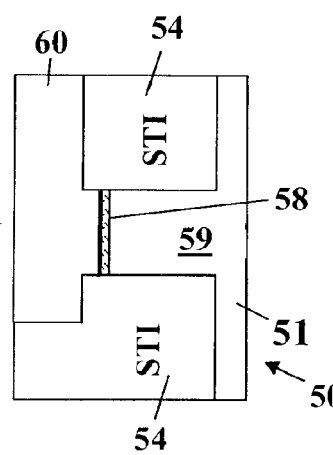
Figure 14K:
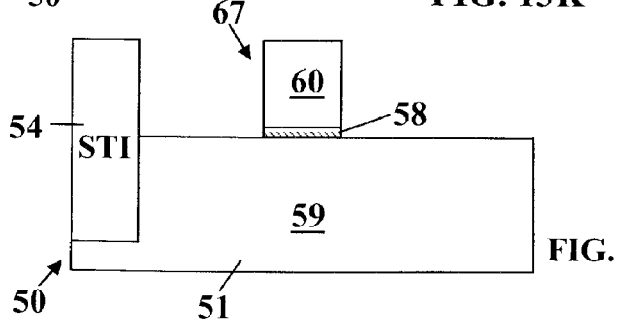

Referring to FIGS. 13K, 14K and 15K taking the result from step BJ, the remaining portions of the pad layer 52 (composed of silicon oxide) leaving the gate electrode stack 67 and the sidewalls thereof exposed in FIG. 14K.

Step BL

Figure 13L:
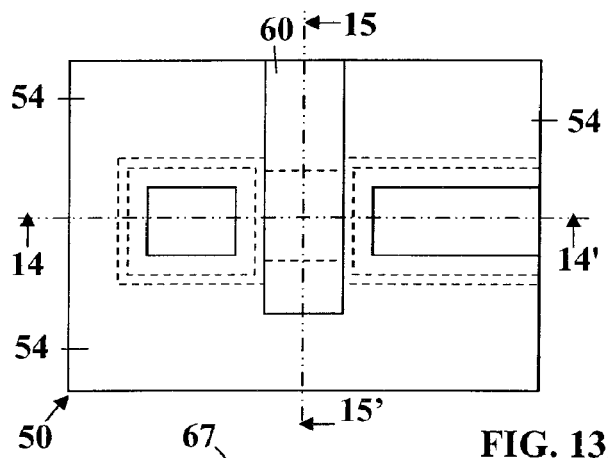
Figure 15L:
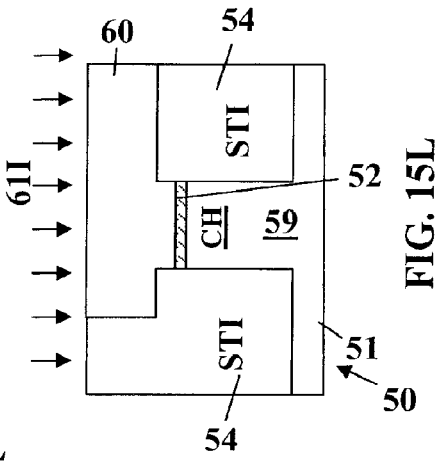
Figure 14L:
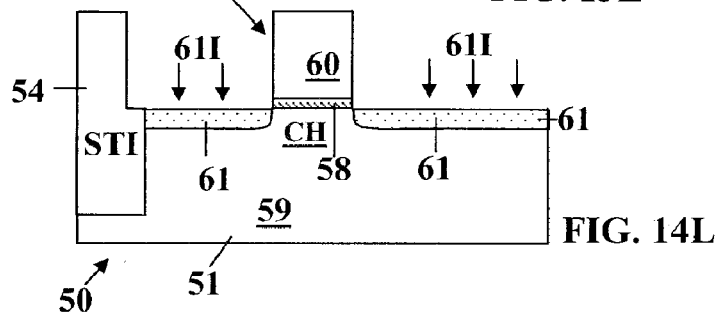

Referring to FIGS. 13L, 14L and 15L taking the result from step BK, ion implant with dopant 611 to form LDD/LDS extensions 61 (and halo regions not shown for convenience of illustration) self-aligned with the gate electrode stack 67.

Step BM

Figure 13M:
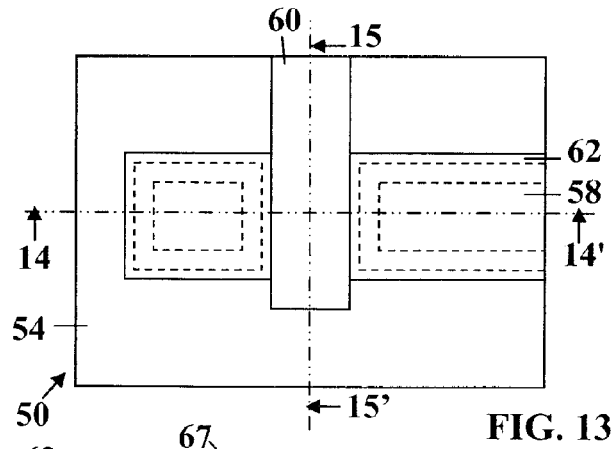
Figure 15M:
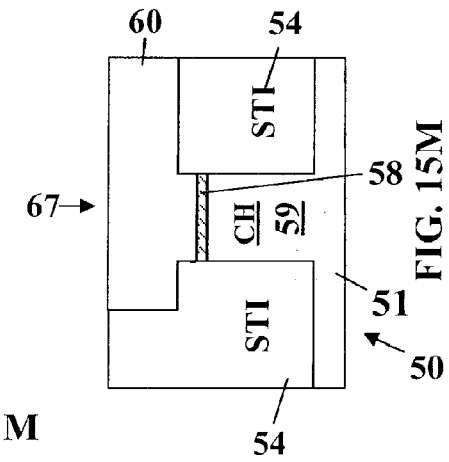
Figure 14M:
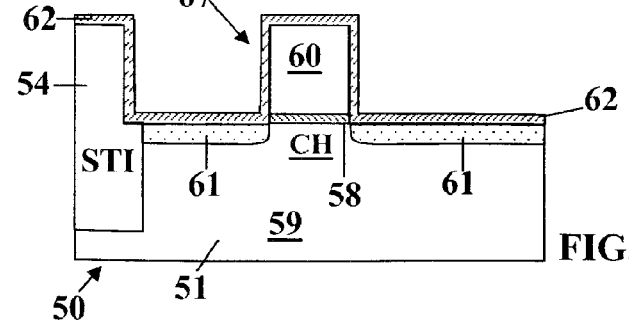

Referring to FIGS. 13M, 14M and 15M taking the result from step BL, deposit a blanket, thin film, conformal, etch-stop layer 62 with a thickness of about 50Å-200 Å covering the STI region 54 top surface and sidewalls, the LDD/LDS regions 61 over the active area 59 on the surface of the substrate 51 and covering the top and sidewalls of the gate electrode stack 67 including the gate electrode 60 and the gate dielectric 58. In the case of formation of silicon oxide the process employed is preferably a LTO (Low Temperature Oxide) deposition process which forms a film having a thickness from a minimum thickness of about 50Å to a maximum thickness of about 200 Å.

Step BN

Referring to FIGS. 13N, 14N and 15N taking the result from step BM, the next step is to form a blanket layer of material to be formed into sidewall spacers 64 composed of a material compatible with the material of RSD elements to be formed next. Preferably layer of material to be formed into sidewall spacers 64 is composed of polysilicon which is etched back in the conventional manner employed to etch back the material of the blanket layer to form the sidewall spacers 64 on the sidewalls of the gate electrode stack 67 and the sidewalls of the STI regions 54. Then a separate etching process is employed to remove the portions of the etch-stop layer 62 unprotected by the sidewall spacers 62. As in the above described process step AE, result of removal of the exposed portions of the etch-stop layer 62 is that L-shaped etch-stop dielectric structures protected by the sidewall spacers 62 are formed with dog leg shapes. A long leg of each etch-stop dielectric structure reaches up along a sidewall of the gate electrodes 60 and the STI region 54 and the shorter leg reaches away from the sidewall over a narrow adjacent portion of the corresponding LDD/LDS extension region 61.

Then optional steps of implanting & annealing to form the source/drain junction regions may follow.

Step BO

Referring to FIGS. 13O, 14O, and 15O taking the result from step BN, a blanket RSD layer 65 is deposited covering the top of the STI region, the top of the gate electrode 60, and covering the sidewall spacers 64 leaving a generally planar top surface above features shown in FIGS. 14N and 15N.

The fact that the sidewall spacers are composed of a material compatible or of identical composition to that of the blanket RSD layer 65 leaves a structure in which the spacers are treated as a part of the blanket RSD layer 65. Alternatively, conventional silicon nitride spacers may be used to form the source/drain junctions where they would be subsequently removed before forming the RSD layer.

Step BP

Referring to FIGS. 13P, 14P, and 15P taking the result from step BO, in step BP dopant 661 is ion implanted into the blanket RSD layer 65. Then the RSD layer 65 is planarized to a common surface to form a set of RSD regions 66 above the LDD/LDS regions 61, in contact with the top surfaces thereof, but separated from the channel CH by the horizontal extension of the L-shaped portions of the etch-stop layer 62 which were formed in step BN. In other words, the result of planarization down below the top surface of the gate electrode 60 provide separation thereof from the RSD regions 66 by exposing the top surfaces of the L-shaped portions of the etch-stop layer 62.

Step BQ

Referring to FIGS. 13Q, 14Q, and 15Q taking the result from step BP, conductive cap layers 68 are formed on the top surface of the gate electrode 60 and the RSD regions 66 by a conventional self-aligned silicide process sequence.

Processing then continues with Middle Of Line (MOL) & Back End Of Line (BEOL) process steps following including formation of studs, which are illustrated in FIG. 3B.

A modification of the process of FIG. 12 is to perform step AF shown in FIG. 4, and described above to form source/drain regions 69 seen in FIG. 3B'.

While this invention has been described in terms of the above specific embodiment(s), those skilled in the art will recognize that the invention can be practiced with modifications within the spirit and scope of the appended claims, i.e. changes can be made in form and detail, without departing from the spirit and scope of the invention. Accordingly all such changes come within the purview of the present invention and the invention encompasses the subject matter of the following claims.

What is claimed is:

1. A method for forming a structure in a semiconductor substrate, said structure including a gate electrode stack of a gate dielectric layer and a gate electrode formed over said substrate, and raised source/drain junctions, said method including the steps comprising:
   forming said gate electrode stack comprising said gate dielectric layer and said gate electrode on said substrate with said gate electrode stack having sidewalls and a top surface;
   forming Lightly Doped Drain/Doped Source (LDD/LDS) regions in said substrate self-aligned with said gate electrode;
   forming a conformal etch-stop layer on said device;
   forming sidewall spacers having a given width over said etch-stop layer on said sidewalls of said gate electrode stack;
   etching away portions of said etch-stop layer unprotected by said sidewall spacers; and
   forming Raised Source/Drain (RSD) regions on said substrate over exposed portions of said LDD/LDS regions in said substrate and covering said etch-stop layer over at least a portion of said sidewalls of said gate electrode.

2. The method of claim 1, including removing said sidewall spacers prior to said step of forming said RSD regions.

3. The method of claim 1, including as follows:
   forming source/drain regions in said substrate after forming said sidewall spacers; and
   then removing said sidewall spacers prior to said step of forming said RSD regions.

4. The method of claim 1, including as follows:
   retaining said sidewall spacers prior to said step of forming said RSD regions; and
   incorporating said sidewall spacers in said RSD regions.

5. The method of claim 1, including as follows:
   forming source/drain regions in said substrate after forming said sidewall spacers; and
   then said sidewall spacers are incorporated into said RSD regions.

6. The method of claim 1, wherein:
   L-shaped portions of said etch-stop layer remain on said sidewalls of said gate electrode stack extending laterally from gate electrode stack by said given width of said spacers; and
   said RSD are formed by epitaxial growth of silicon over said substrate and over a portion of said etch-stop layer into juxtaposition with said sidewalls.

7. The method of claim 1, wherein:
   L-shaped portions of said etch-stop layer remain on said sidewalls of said gate electrode stack extending laterally from gate electrode stack by said given width of said spacers; and
   forming said RSD regions by blanket deposition of RSD silicon covering said substrate and said spacers followed by etching back said RSD silicon and doping thereof.

8. The method of claim 1 including:
   forming said sidewall spacers from silicon nitride;
   subsequently performing said step of etching away portions of said etch-stop layer unprotected by said sidewall spacers;
   then removing said sidewall spacers; and
   then growing said RSD regions over said substrate.

9. The method of claim 1, including:
   forming said sidewall spacers from polysilicon;
   subsequently performing said step of etching away portions of said etch-stop layer unprotected by said sidewall spacers;
   then depositing a blanket layer of polysilicon; and
   then etching back said polysilicon to form said RSD regions.

10. The method of claim 1 wherein said etch-stop layer has a thickness within a range from a minimum thickness of about 50Å to a maximum thickness of about 200Å.

* * * * *